(12) United States Patent
Park et al.

(10) Patent No.: US 11,688,334 B2
(45) Date of Patent: Jun. 27, 2023

(54) DISPLAY APPARATUS AND CONTROL METHOD THEREOF

(71) Applicant: SAMSUNG ELECTRONICS CO., LTD., Suwon-si (KR)

(72) Inventors: Sangyoung Park, Suwon-si (KR); Hoseop Lee, Suwon-si (KR); Tetsuya Shigeta, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/669,004

(22) Filed: Feb. 10, 2022

(65) Prior Publication Data

US 2022/0254301 A1 Aug. 11, 2022

Related U.S. Application Data

(63) Continuation of application No. PCT/KR2022/001863, filed on Feb. 7, 2022.

(30) Foreign Application Priority Data

Feb. 10, 2021 (KR) .................... 10-2021-0019130

(51) Int. Cl.
*G09G 3/22* (2006.01)
*G09G 3/32* (2016.01)

(52) U.S. Cl.
CPC ....... *G09G 3/32* (2013.01); *G09G 2300/0465* (2013.01); *G09G 2310/061* (2013.01); *G09G 2310/08* (2013.01); *G09G 2340/0435* (2013.01)

(58) Field of Classification Search
CPC ............... G09G 3/32; G09G 2310/061; G09G 2310/08; G09G 2340/0435
See application file for complete search history.

(56) References Cited

U.S. PATENT DOCUMENTS 9,984,664 B2 5/2018 Glen et al.
10,638,086 B2 4/2020 Ahn et al.
(Continued)

FOREIGN PATENT DOCUMENTS

CN 106205460 B 11/2018
KR 10-2010-0114454 A 10/2010
(Continued)

OTHER PUBLICATIONS

International Search Report (PCT/ISA/210) dated May 26, 2022 by the International Searching Authority in counterpart International Application No. PCT/KR2022/001863.

*Primary Examiner* — Sanghyuk Park
(74) *Attorney, Agent, or Firm* — Sughrue Mion, PLLC

(57) ABSTRACT

A display apparatus, according to one or more embodiments, includes a timing controller configured to generate a timing control signal, and a plurality of display modules, each display module of the plurality of display modules including a plurality of pixels and a plurality of micro pixel controllers electrically connected to a plurality of inorganic light-emitting elements constituting two or more pixels, wherein each display module of the plurality of display modules is configured to switch the plurality of inorganic light-emitting elements based on the timing control signal, and wherein each of the plurality of micro pixel controllers switches the plurality of inorganic light-emitting elements causing a blanking period to be periodically generated in response to a frame rate being changed.

15 Claims, 19 Drawing Sheets

(56) References Cited

U.S. PATENT DOCUMENTS

| | | | |
|---|---|---|---|
| 10,657,862 B2 | 5/2020 | Zhang | |
| 2012/0147020 A1* | 6/2012 | Hussain | G09G 5/006 |
| | | | 345/522 |
| 2014/0168197 A1 | 6/2014 | Kobayashi et al. | |
| 2017/0193971 A1* | 7/2017 | Bi | G09G 5/18 |
| 2022/0199025 A1* | 6/2022 | Hong | G09G 3/3233 |

FOREIGN PATENT DOCUMENTS

| | | |
|---|---|---|
| KR | 10-2012-0039690 A | 4/2012 |
| KR | 10-2014-0110242 A | 9/2014 |
| KR | 10-2018-0039232 A | 4/2018 |
| KR | 10-2018-0119273 A | 11/2018 |

\* cited by examiner

DISPLAY APPARATUS AND CONTROL METHOD THEREOF

CROSS-REFERENCE TO RELATED APPLICATIONS

This application is a by-pass continuation application of International Application No. PCT/KR2022/001863, filed on Feb. 7, 2022, which claims priority from Korean Patent Application No. 10-2021-0019130, filed on Feb. 10, 2021, in the Korean Intellectual Property Office, the disclosures of which are incorporated by reference herein in their entireties.

BACKGROUND

1. Field

Embodiments of the present disclosure relate to a display apparatus that implements an image using an inorganic light-emitting element, and a control method thereof.

2. Description of the Related Art

A display apparatus may be classified into a self-emitting display in which each pixel emits light by itself and a passive light-emitting display that requires a separate light source.

A liquid crystal display (LCD) may be a typical passive light-emitting display, and may need a backlight unit that supplies light from the rear of a display panel, a liquid crystal layer that serves as a switch to transmit/block light, a color filter that changes supplied light to a desired color, and the like. Thus, the LCD may be structurally complicated and may have a limitation in realizing a small thickness.

Alternatively or additionally, in the self-emitting display in which each pixel may emit light by itself by including a light-emitting element for each pixel, components such as a backlight unit and a liquid crystal layer may not be required and a color filter can also be omitted. Thus, the self-emitting display may be structurally simple and may have a higher degree of freedom in design, when compared to an LCD. As such, the self-emitting display may realize not only a small thickness, but may also have an improved contrast ratio, brightness, and viewing angle.

Among self-emitting displays, a micro-light-emitting diode (micro-LED) display is one of flat panel displays and may be composed of a plurality of LEDs each having a size of about 100 micrometers (μm). In comparison with the LCD that may require a backlight, the micro-LED display may provide better contrast, response time, and energy efficiency.

Further, the micro-LED, which is an inorganic light-emitting element, may have higher brightness, better luminous efficiency, and a longer lifespan in comparison with an organic light-emitting diode (OLED), which may require a separate encapsulation layer for protecting organic materials.

SUMMARY

Aspects of the present disclosure provide a display apparatus allowing a frame rate to be varied in response to a source signal and a blanking period to be generated periodically in response to the frame rate being changed.

In accordance with one aspect of the present disclosure, a display apparatus according to one or more embodiments includes a timing controller configured to generate a timing control signal, and a plurality of display modules, each display module of the plurality of display modules including a plurality of pixels and a plurality of micro pixel controllers electrically connected to a plurality of inorganic light-emitting elements constituting two or more pixels, wherein each display module of the plurality of display modules is configured to switch the plurality of inorganic light-emitting elements based on the timing control signal, and wherein each of the plurality of micro pixel controllers switches the plurality of inorganic light-emitting elements causing a blanking period to be periodically generated in response to a frame rate being changed.

In accordance with another aspect of the present disclosure, there is provided a control method of a display apparatus, the control method includes controlling a plurality of micro pixel controllers to switch a plurality of inorganic light-emitting elements based on a timing control signal of the timing controller of the display apparatus, and switching the plurality of inorganic light-emitting elements by controlling the plurality of micro pixel controllers causing a blanking period to be periodically generated in response to a frame rate being changed.

In accordance with another aspect of the present disclosure, a display apparatus includes a timing controller configured to generate a timing control signal; and a plurality of display modules, each display module of the plurality of display modules comprising a plurality of pixels, and a plurality of micro pixel controllers electrically connected to a plurality of inorganic light-emitting elements constituting two or more pixels, wherein each display module of the plurality of display modules is configured to switch the plurality of inorganic light-emitting elements based on the timing control signal, and wherein each micro pixel controller of the plurality of micro pixel controllers is configured to switch the plurality of inorganic light-emitting elements causing a blanking period to be periodically generated in response to a frame rate being changed, and wherein a first period of the blanking period before the frame rate is changed matches a second period of the blanking period after the frame rate has been changed, and wherein the timing controller is configured to transmit, in response to the frame rate being changed, the timing control signal for periodically generating the blanking period to the plurality of micro pixel controllers of each display module of the plurality of display modules.

In accordance with another aspect of the present disclosure, a display apparatus includes a timing controller configured to generate a timing control signal, and a display panel including a plurality of pixels and a plurality of thin-film transistor (TFT) circuits configured to supply a driving current to each of the plurality of pixels based on the timing control signal, wherein the timing controller may transmit a driving signal to the plurality of TFT circuits causing a blanking period to be periodically generated in response to a frame rate being changed.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
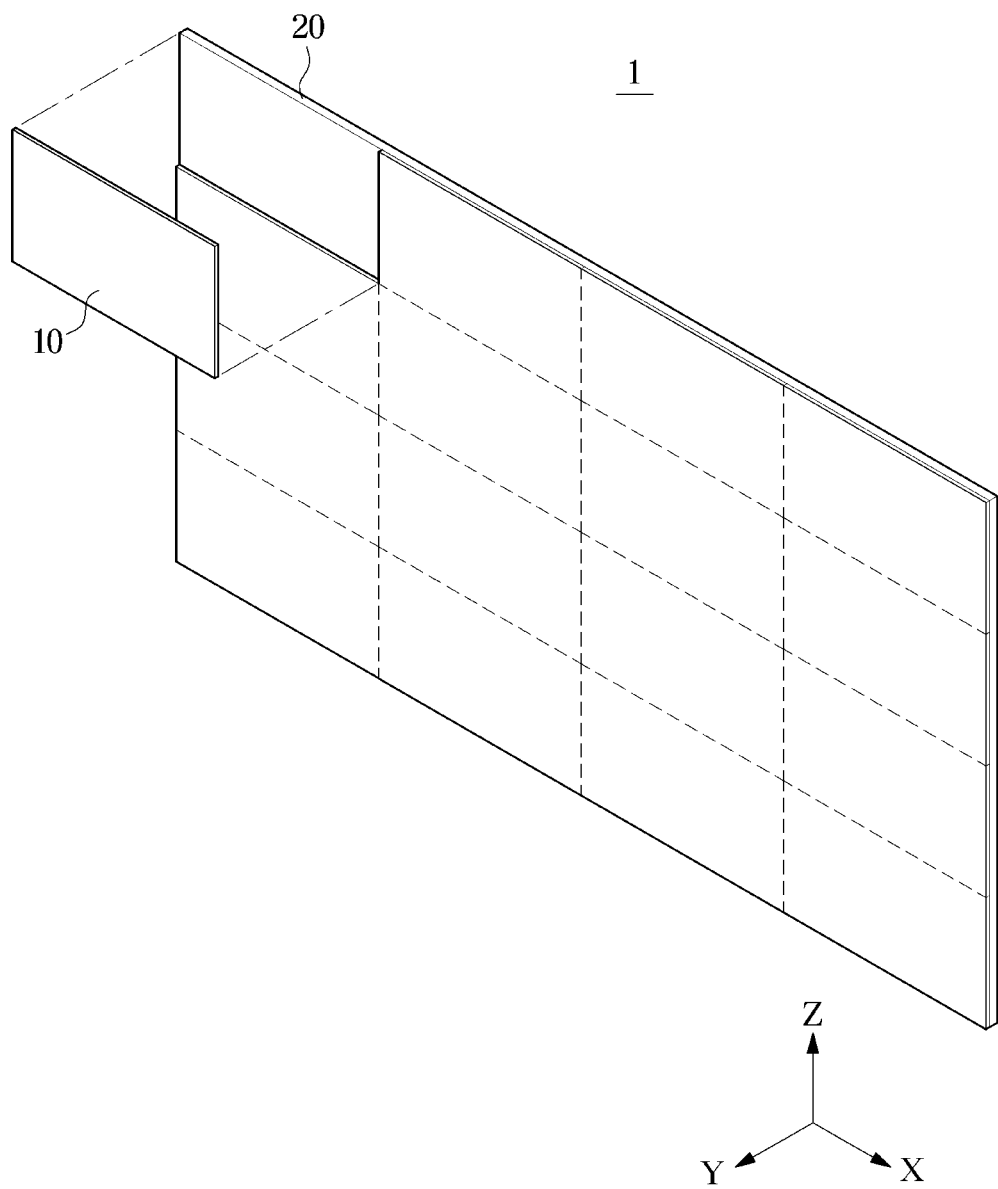
FIG. 1 is a perspective view illustrating an example of a display module and a display apparatus having the same, according to one or more embodiments.

Embodiments disclosed in the present specification and the components shown in the drawings are merely exemplary embodiments of the disclosed disclosure and various modifications capable of replacing the embodiments and drawings of the present specification may be made at the time of filing the present application.

Throughout the present specification, when a part is referred to as being "connected" to other parts, it includes not only a direct connection but also an indirect connection, and the indirect connection includes a connection through a wireless communication network.

Further, terms used herein are used to illustrate the embodiments and are not intended to limit and/or to restrict the disclosed disclosure. As used herein, singular forms are intended to include plural forms as well, unless the context clearly indicates otherwise. Terms "comprise," "have," and the like are used herein to specify the presence of stated features, numerals, steps, operations, components, parts or combinations thereof but do not preclude the presence or addition of one or more other features, numerals, steps, operations, components, parts, or combinations thereof.

Further, terms including ordinal numbers such as "first," "second," and the like used herein may be used to describe various components, but the components are not limited by these terms. The terms are used merely for the purpose of distinguishing one component from another. For example, without departing from the scope of the present disclosure, a first component may be referred to as a second component, and similarly, a second component may be referred to as a first component.

Further, terms such as "~er/or," "~part," "block," "member," "module" may refer to a unit for processing at least one function or operation. For example, these terms may refer to at least one process implemented by software, a hardware component such as a field-programmable gate array (FPGA) or an application-specific integrated circuit (ASIC), or a combination of software and hardware.

A reference numeral attached in each of operations is used to identify each of the operations, and this reference numeral does not describe the order of the operations, and the operations may be performed differently from the described order unless clearly specified in the context.

Hereinafter, embodiments of the present disclosure will be described in detail with reference to the accompanying drawings.

Figure 2:
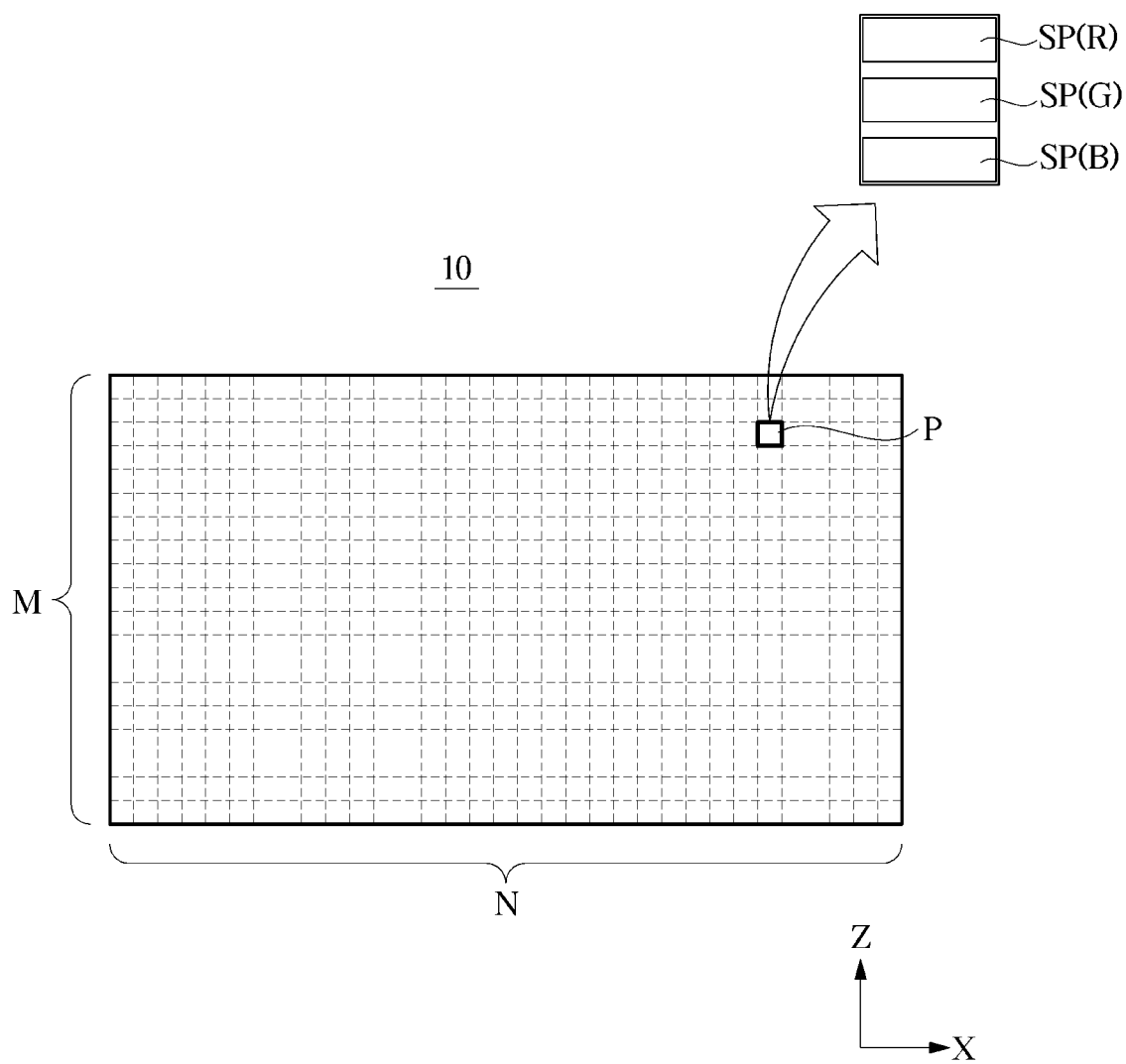
FIG. 2 is a view illustrating an example of an arrangement of pixels constituting a unit module of the display apparatus, according to one or more embodiments.

FIG. 1 is a perspective view illustrating an example of a display module and a display apparatus having the same, according to one or more embodiments, and FIG. 2 is a view illustrating an example of an arrangement of pixels constituting a unit module of the display apparatus, according to one or more embodiments.

In some embodiments, a display apparatus 1 is a self-emitting display apparatus in which a light-emitting element is disposed for each pixel so that each pixel may emit light by itself. Accordingly, unlike a liquid crystal display (LCD) apparatus, since a component such as a backlight unit, a liquid crystal layer, or the like may not be required, the display apparatus 1 may be realized using a small thickness, and various design changes may be possible due to the simple structure.

Alternatively or additionally, the display apparatus 1 may employ an inorganic light-emitting element, such as an inorganic light-emitting diode (LED), as the light-emitting element disposed in each pixel. The inorganic light-emitting element may have a faster response speed than an organic light-emitting element such as an organic light-emitting diode (OLED), and may realize high luminance with low power.

Moreover, in comparison with the organic light-emitting element that requires an encapsulation process because the organic light-emitting element is vulnerable to exposure to moisture and oxygen and has poor durability, the inorganic light-emitting element does not require the encapsulation process and has better durability. Hereinafter, the inorganic light-emitting element mentioned in the embodiments to be described below may refer to an inorganic LED.

In some embodiments, the inorganic light-emitting element employed in the display apparatus 1 may be a micro-LED having a short side length of about 100 micrometers (μm). As described above, by employing the micro-scale LED, a pixel size may be reduced and a higher resolution may be realized within the same size screen.

Alternatively or additionally, when an LED chip is manufactured in a micro-scale size, it is possible to solve a problem in which the LED chip is broken due to characteristics of inorganic materials after being bent. That is, when the micro-LED chip is transferred to a flexible substrate, the LED chip is not broken even when the substrate is bent, so that a flexible display apparatus may also be implemented.

A display apparatus 1 employing a micro-LED may be applied to various fields by using a very small pixel size and a thin thickness. As an example, as shown in FIG. 1, by tiling a plurality of display modules 10, to each of which a plurality of micro-LEDs are transferred, and then fixing the plurality of display modules 10 to a housing 20, it is possible to implement a large-area screen. For example, the display apparatus 1 of the large-area screen may be used as signage, an electric billboard, or the like.

Alternatively or additionally, a three-dimensional coordinate system of XYZ axes, as shown in FIG. 1, may be based on the display apparatus 1. For example, a plane on which a screen of the display apparatus 1 is located is an XZ plane, and a direction in which an image is output or an inorganic light-emitting element emits light is a +Y direction. Since the coordinate system is based on the display apparatus 1, the same coordinate system may be applied to both cases in which the display apparatus 1 is lying down and the display apparatus 1 is upright.

In general, the display apparatus 1 is used in an upright state, and a user views an image from the front of the display apparatus 1, so that the +Y direction in which the image is output may be referred to as a front side, and a direction opposite to the front side may be referred to as a rear side.

Alternatively or additionally, the display apparatus 1 is generally manufactured in a state of lying down. Accordingly, a −Y direction of the display apparatus 1 may be referred to as a downward direction, and the +Y direction may be referred to as an upward direction. That is, in the embodiments described below, the +Y direction may be referred to as the upward direction or may also be referred to as the front side, and the −Y direction may be referred to as the downward direction or may also be referred to as the rear side.

The other four surfaces except for an upper surface and a lower surface of the flat-panel-type display apparatus 1 or display module 10 are referred to as side surfaces regardless of a posture of the display apparatus 1 or the display module 10.

In the example of FIG. 1, the display apparatus 1 is illustrated as implementing a large-area screen by including the plurality of display modules 10, but the embodiments of the display apparatus 1 is not limited thereto. The display apparatus 1 may also be implemented as a television (TV), a wearable device, a portable device, a monitor for a personal computer (PC), and the like by including a single display module 10.

Referring to FIG. 2, the display module 10 may include pixels in an M×N (e.g., M and N are integers greater than or equal to 2) array, that is, a plurality of pixels arranged two dimensionally (2D). FIG. 2 conceptually illustrates a pixel arrangement, and thus, in the display module 10, alternatively or additionally to an active region in which pixels are arranged, a bezel region or a line region in which an image is not displayed may also be located.

In some embodiments, when it is described that certain components are arranged two dimensionally, this may include a case in which the corresponding components are arranged on the same plane, as well as, a case in which the corresponding components are arranged on different planes parallel to each other. Alternatively or additionally, in the case in which the corresponding components are disposed on the same plane, upper ends of the arranged components do not necessarily have to be located on the same plane, and the upper ends of the arranged components may be located on different planes that are parallel to each other.

Referring to FIG. 2, a pixel P may include a plurality of sub-pixels that output light of different colors in order to implement various colors by a color combination. For example, the pixel P may be composed of at least three sub-pixels outputting light of different colors. For example, the pixel P may be composed of three sub-pixels SP(R), SP(G), and SP(B), which respectively correspond to red (R), green (G), and blue (B). Here, a red sub-pixel SP(R) may output red light, a green sub-pixel SP(G) may output green light, and a blue sub-pixel SP(B) may output blue light.

However, the pixel arrangement of FIG. 2 is merely an example that may be applied to the display module 10 and the display apparatus 1, and the sub-pixels may be arranged along an X-axis direction, may not be arranged in a line, and may be implemented to have different sizes. In order to implement various colors, a single pixel only needs to include a plurality of sub-pixels, and there is no limitation on a size of each sub-pixel or an arrangement method of the sub-pixels.

Alternatively or additionally, the pixel P is not necessarily composed of the red sub-pixel SP(R) configured to output red light, the green sub-pixel SP(G) configured to output green light, and the blue sub-pixel SP(B) configured to output blue light, and may include a sub-pixel configured to output yellow light or white light. That is, there is no limitation on the color or type of light output from each sub-pixel and the number of sub-pixels.

However, in the embodiments to be described below, for detailed description, the case in which the pixel P includes the red sub-pixel SP(R), the green sub-pixel SP(G), and the blue sub-pixel SP(B) will be described as an example.

As described above, each of the display module 10 and the display apparatus 1 is a self-emitting display apparatus in which each pixel may emit light by itself. Accordingly, an inorganic light-emitting element that emits light of different colors may be disposed in each sub-pixel. For example, a red inorganic light-emitting element may be disposed in the red sub-pixel SP(R), a green inorganic light-emitting element may be disposed in the green sub-pixel SP(G), and a blue inorganic light-emitting element may be disposed in the blue sub-pixel SP(B).

Accordingly, in some embodiments, the pixel P may represent a cluster including the red inorganic light-emitting element, the green inorganic light-emitting element, and the blue inorganic light-emitting element, and the sub-pixel may represent each inorganic light-emitting element.

Figure 3:
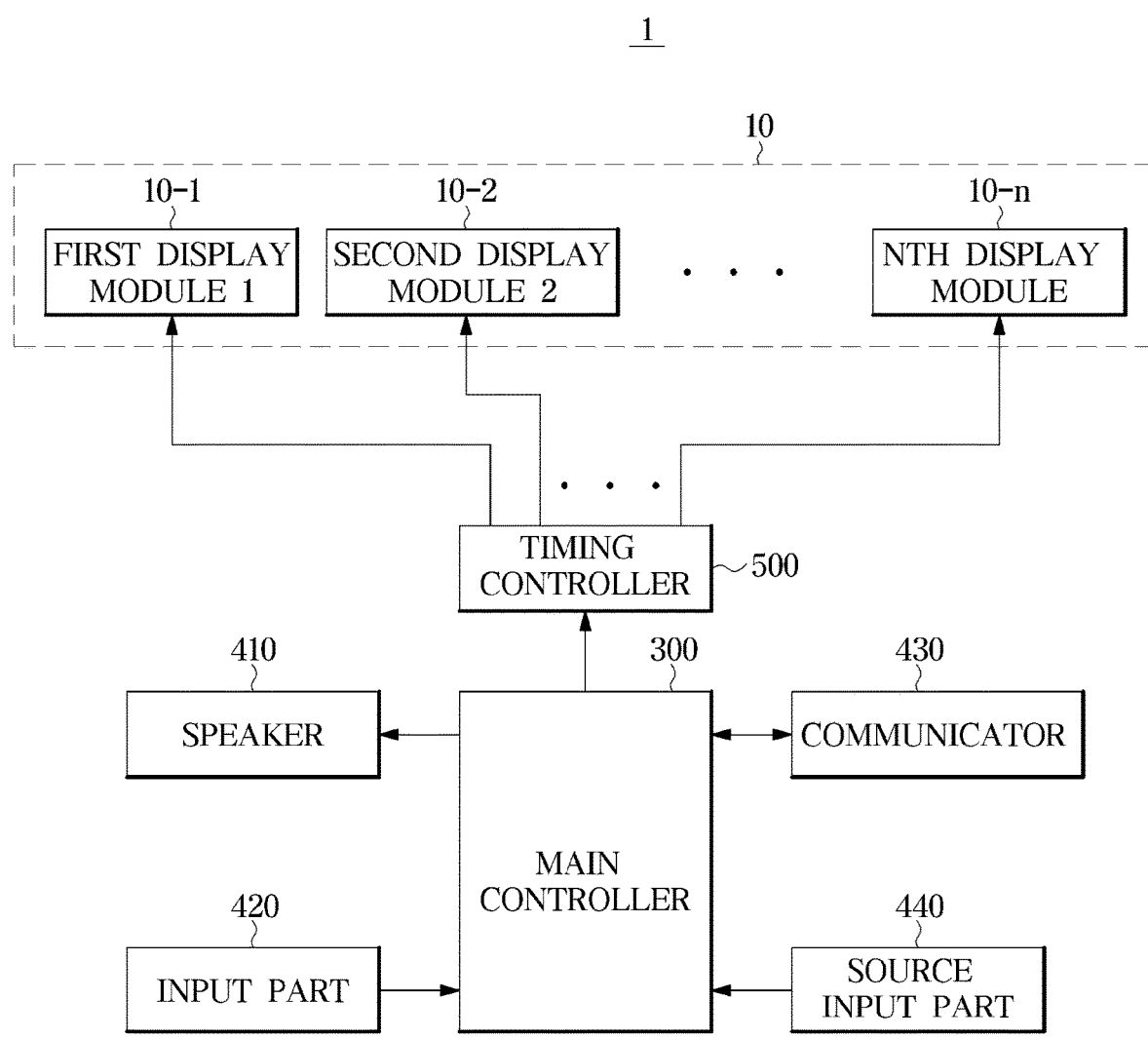
FIG. 3 is a first control block diagram of the display apparatus, according to one or more embodiments.
Figure 4:
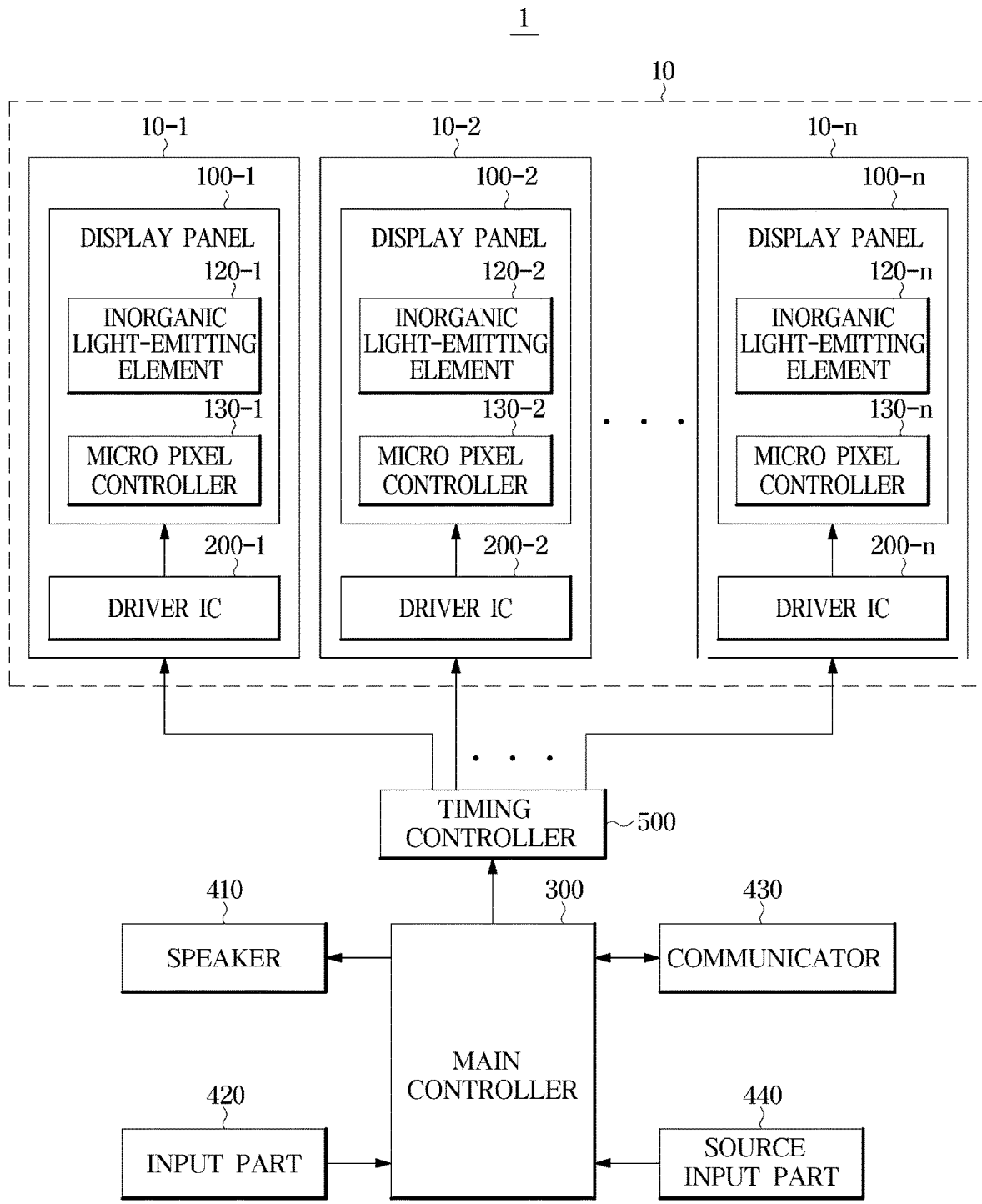
FIG. 4 is a second control block diagram of the display apparatus, according to one or more embodiments.

FIGS. 3 and 4 are control block diagrams of the display apparatus 1 according to one or more embodiments.

Referring to FIG. 3, the display apparatus 1, according to one or more embodiments, may include a plurality of display modules (e.g., 10-1, 10-2, . . . , and 10-n, where n is an integer greater than or equal to two) and may include a main controller 300 and a timing controller 500, which are configured to control the plurality of display modules 10, a communicator 430 configured to communicate with an external device, a source inputter 440 configured to receive a source image, a speaker 410 configured to output sound, and an inputter 420 configured to receive a command for controlling the display apparatus 1 from the user.

The inputter 420 may include a button and/or a touch pad provided in one region of the display apparatus 1, and when a display panel (e.g., display panels 100-1 through 100-n of FIG. 4, hereinafter display panel 100) is implemented as a touch screen, the inputter 420 may include a touch pad provided on a front surface of the display panel 100. Alternatively or additionally, the inputter 420 may also include a remote controller.

The inputter 420 may receive various commands for controlling the display apparatus 1, such as power on/off, volume adjustment, channel adjustment, screen adjustment, various setting changes, or the like of the display apparatus 1, from the user.

For example, the inputter 420 may receive an input for selecting a mode of the display apparatus 1 from the user. For example, the display apparatus 1 may receive an input for a first mode (e.g., a general mode) from the user through the inputter 420, and may activate the first mode so that a frame rate is fixed. Alternatively or additionally, the display apparatus 1 may receive an input for a second mode (e.g., a game mode) from the user through the inputter 420, and activate the second mode so that the frame rate is varied in response to a source signal.

The speaker 410 may be provided in one region of the housing 20, and a separate speaker module physically separated from the housing 20 may be further provided.

The communicator 430 may transmit and receive necessary data by performing communication with a relay server or other electronic devices. The communicator 430 may employ at least one of various wireless communication methods, such as 3rd Generation (3G), 4th Generation (4G), wireless LAN, Wi-Fi, Bluetooth, Zigbee, Wi-Fi Direct (WFD), ultra-wide band (UWB), infrared data association (IrDA), Bluetooth low energy (BLE), near field communication (NFC), and Z-wave. The communicator 430 may also employ a wired communication method such as peripheral component interconnect (PCI), PCI-express, or universal serial bus (USB).

The source inputter 440 may receive a source signal input from a game console, a set-top box, a USB, an antenna, and the like. Accordingly, the source inputter 440 may include at least one selected from a source input interface group including a high definition multimedia interface (HDMI) cable port, a USB port, an antenna, and the like.

The source signal received by the source inputter 440 may be processed by the main controller 300 to be converted into a form that may be output by the display panel 100 and/or the speaker 410.

The main controller 300 and the timing controller 500 may include at least one memory (not shown), which is configured to store programs for performing operations to be described below and various types of data, and at least one processor configured to execute the stored programs.

The main controller 300 may process the source signal input through the source inputter 440 to generate an image signal corresponding to the input source signal.

For example, the main controller 300 may include a source decoder, a scaler, an image enhancer, and a graphics processor. The source decoder may decode a source signal compressed in a format such as a Motion Picture Experts Group (MPEG) format, and the scaler may output image data of a desired resolution through resolution conversion.

The image enhancer may improve the image quality of the image data by applying various correction techniques. The graphics processor may classify pixels of the image data into RGB data and output the image data together with a control signal such as a syncing signal for display timing in the display panel 100. That is, the main controller 300 may output and the control signal and image data corresponding to the source signal.

Alternatively or additionally, the main controller 300 may change the frame rate of the image data so as to correspond to a frame rate of the source signal. Accordingly, in the display apparatus 1, the source signal may be output without being damaged (e.g., distorted) by allowing the frame rate to be varied according to the source signal.

The above-described operation of the main controller 300 is merely an example applicable to the display apparatus 1, and the main controller 300 may further perform other operations, or some of the operations described above may be omitted.

The image data and the control signal output from the main controller 300 may be transmitted to the timing controller 500.

The timing controller 500 may convert the image data transmitted from the main controller 300 into image data of a format that may be processed in a driver integrated circuit (IC) (e.g. driver ICs 200-1 through 200-n of FIG. 4, hereinafter driver IC 200), and generate various control signals such as a timing control signal necessary for displaying the image data on the display panel 100.

Alternatively or additionally, the timing controller 500 may generate the timing control signal so that the blanking period is periodically generated. The blanking period refers to a period in which the entire screen of the display apparatus 1 is turned off by momentarily turning off each of the inorganic light-emitting elements included in the display apparatus 1, and the inorganic light-emitting element does not emit light since a driving current is not supplied to each of the inorganic light-emitting elements during the blanking period. The display apparatus 1 may determine whether an overcurrent is detected on the basis that the driving current is not supplied to the inorganic light-emitting element during the blanking period.

In some embodiments, the display apparatus 1 does not include the plurality of display modules 10, but in the embodiments to be described below, for detailed description, an operation of each component will be described in detail by taking the display apparatus 1, including the plurality of display modules 10, as an example.

Referring to FIG. 4, each display module of the plurality of display modules 10 (e.g., 10-1, 10-2, . . . , and 10-n) may include a corresponding display panel 100 (e.g., 100-1, 100-2, . . . , and 100-n) configured to display an image and the corresponding driver IC 200 (e.g., 200-1, 200-2, . . . , and 200-n) configured to drive the corresponding display panel 100.

The display panel 100 may include a plurality of pixels arranged two dimensionally as described above, and each of the pixels may be composed of a plurality of sub-pixels to implement various colors.

Alternatively or additionally, as described above, the display apparatus 1, according to one or more embodiments, is a self-emitting display apparatus in which each pixel may emit light by itself. Accordingly, an inorganic light-emitting element 120 (e.g., 120-1, 120-2, . . . , and 120-n, hereinafter inorganic light-emitting elements 120) may be disposed in each sub-pixel. That is, each of the plurality of pixels may include two or more inorganic light-emitting elements 120.

Each of the inorganic light-emitting elements 120 may be driven by an active matrix (AM) method or a passive matrix (PM) method, but in the embodiments to be described below, for detailed description, a case in which the inorganic light-emitting element 120 is driven by the AM method will be described as an example.

In the display module 10, according to one or more embodiments, each inorganic light-emitting element 120 may be individually controlled by a micro pixel controller 130 (e.g., 130-1, 130-2, . . . , and 130-n, hereinafter micro pixel controller 130), and the micro pixel controller 130 may operate in response to a driving signal output from the driver IC 200 or the timing control signal output from the timing controller 500.

The micro pixel controller 130 may switch the inorganic light-emitting element electrically connected thereto on the basis of the timing control signal output from the timing controller 500. For example, the micro pixel controller 130 may switch the inorganic light-emitting element electrically connected thereto on the basis of the timing control signal so that the blanking period is periodically generated.

Figure 5:
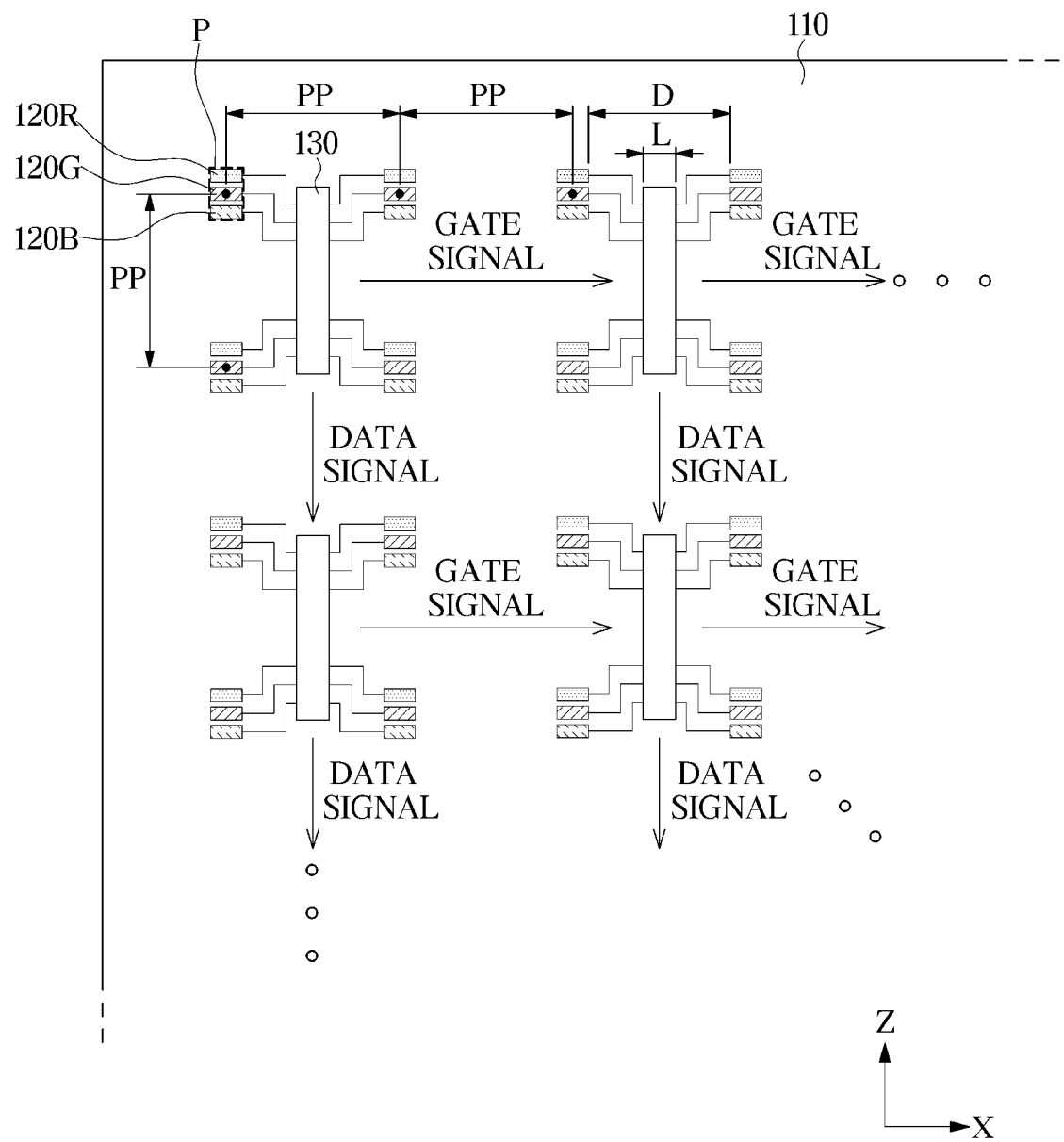
FIG. 5 is a diagram illustrating a first example of an arrangement of micro pixel controllers in the display module, according to one or more embodiments.
Figure 6:
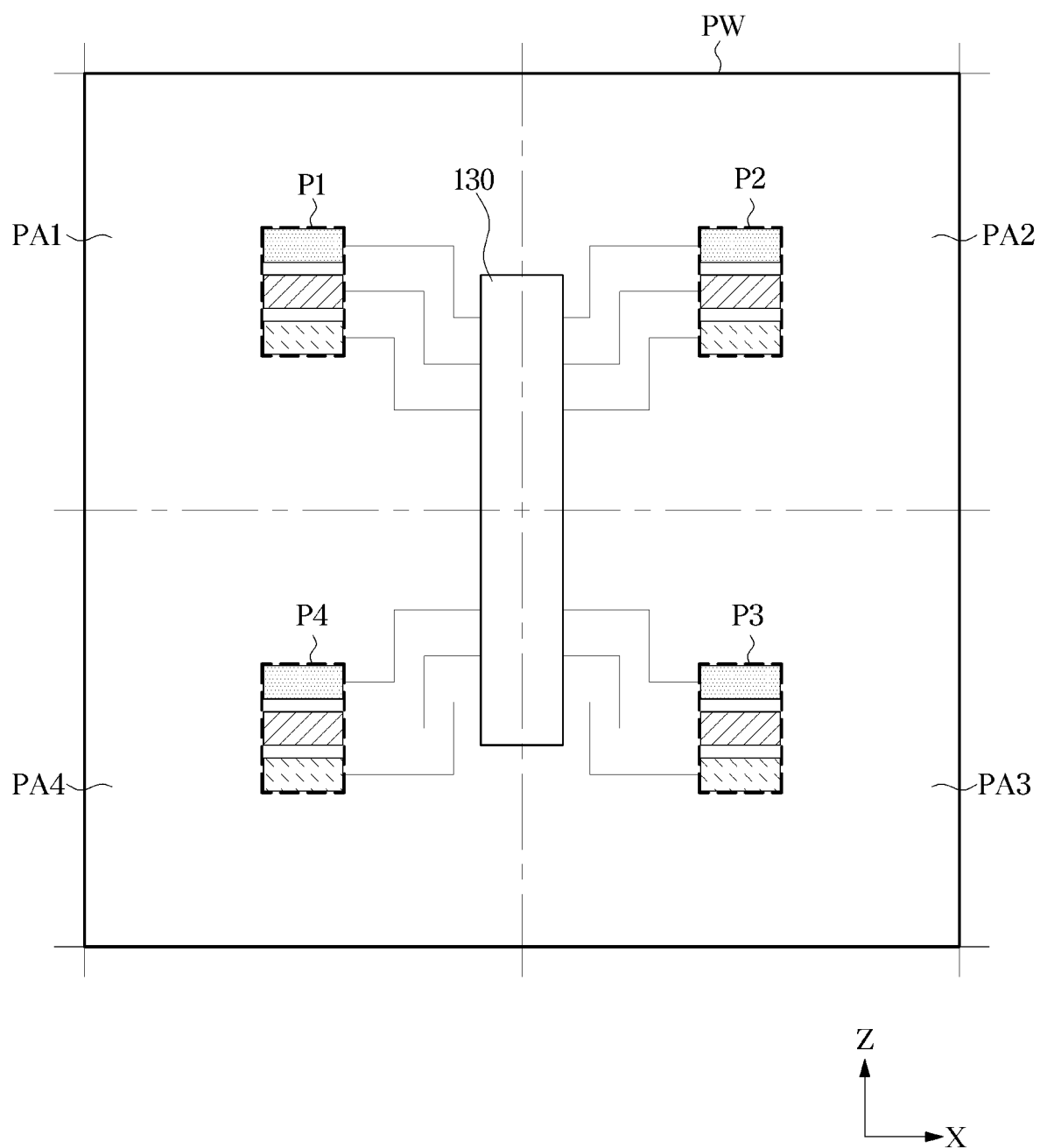
FIG. 6 is a diagram illustrating a second example of an arrangement of micro pixel controllers in the display module, according to one or more embodiments.

FIGS. 5 and 6 are diagrams illustrating an example of an arrangement of the micro pixel controllers 130 in the display module 10, according to one or more embodiments.

Referring to FIG. 5, a plurality of pixels P are arranged two dimensionally on an upper surface of a module substrate 110, and the micro pixel controller 130 may be disposed in a space of the upper surface of the module substrate 110, in which the pixels P are not disposed.

When the plurality of pixels P are arranged on the module substrate 110, pixel intervals PP between adjacent pixels located on upper, lower, left, and right sides may all be identically maintained. In some embodiments, when it is described that certain values are identical, this may include not only a case in which the corresponding values are completely identical but also a case in which the corresponding values are identical within a predetermined error range.

The pixel interval PP may be referred to as a pixel pitch, and some embodiments, the pixel interval PP may be defined as representing a distance from a center of one pixel to a center of an adjacent pixel. However, since the embodiments of the display module 10 are not limited thereto, other definitions may be applied to the pixel interval PP.

One micro pixel controller 130 may control two or more pixels P, and the micro pixel controller 130 may be disposed in a space between the two or more pixels P. In the example of FIG. 5, a case in which one micro pixel controller 130 controls four pixels P is illustrated, but the embodiments of the display module 10 are not limited thereto, and there is no limitation on the number of the pixels P controlled by the micro pixel controller 130.

For example, when the micro pixel controller 130 has a rectangular parallelepiped shape, a length L of a short side of an upper or lower surface of the micro pixel controller 130 may be provided with a very small size that is less than a distance D between boundary lines of adjacent pixels P, and the short side of the micro pixel controller 130 may be disposed parallel to a perpendicular line indicating the shortest distance between two adjacent pixels P. For example, the distance D between the boundary lines of the adjacent pixels P may mean a distance between the inorganic light-emitting elements 120 included in different pixels P among the inorganic light-emitting elements 120 adjacent to each other.

That is, the micro pixel controller 130 may be disposed without affecting the intervals between the plurality of pixels P. Accordingly, even when the micro pixel controller 130 is disposed between the pixels P, the distance between the pixels P may be minimized so that a higher resolution may be realized within the same area.

On the other hand, when one micro pixel controller 130 controls the pixels P of an m×2 array (where m is an integer greater than or equal to one), as shown in FIG. 6, the micro pixel controller 130 may be disposed between two columns in which the pixels P to be controlled (hereinafter, used interchangeably with "control target pixel") are disposed.

Alternatively or additionally, when one micro pixel controller 130 controls the pixels P of a 2×n array (where n is an integer greater than or equal to one), it is also possible that the micro pixel controller 130 is disposed between two rows in which the pixels P to be controlled are disposed.

Referring to FIG. 6, the micro pixel controller 130 may be disposed in at least one of pixel regions PA1, PA2, PA3, and PA4 of four pixels P1, P2, P3, and P4 that are controlled by the micro pixel controller 130. In some embodiments, the pixel region is a region in which each pixel is located, and when an active region of the display panel 100 is partitioned into arrays (M×N) equal to arrays of the pixels, a region including each pixel may be defined as a pixel region of the corresponding pixel.

For example, the micro pixel controller 130 may be disposed in one of the pixel regions PA1, PA2, PA3, and PA4 of the pixels controlled by the micro pixel controller 130, may be disposed over two regions of the pixel regions PA1, PA2, PA3, and PA4, may be disposed over three regions of the pixel regions PA1, PA2, PA3, and PA4, or may be disposed over four regions of the pixel regions PA1, PA2, PA3, and PA4 as shown in FIG. 6.

Alternatively or additionally, the micro pixel controller 130 may be disposed at a center of one region in which the pixel regions PA1, PA2, PA3, and PA4 of the four pixels P1, P2, P3, and P4 controlled by the micro pixel controller 130 are combined, that is, at a center of an entire pixel region PW.

When the micro pixel controller 130 is disposed as described above, a driving current may be efficiently supplied to the plurality of pixels P controlled by the micro pixel controller 130. A detailed configuration for supplying the driving current to the control target pixels P will be described below.

Alternatively or additionally, the micro pixel controller 130 may be electrically connected to the control target pixels to control the plurality of pixels P. In some embodiments, when it is described that two components are electrically connected, this may include a case in which the two components are connected through lines, and/or a case in which, between the two components, conductive materials through which electricity flows are directly soldered or a case in which a conductive adhesive is used. There is no restriction on a specific connection method as long as current flows between two connected components.

For example, when soldering two components, gold-indium (Au—In) bonding, gold-tin (Au—Sn) bonding, copper (Cu) pillar/tin-silver (SnAg) bump bonding, and nickel (Ni) pillar/SnAg bump bonding, solder ball bonding using tin-silver-copper (SnAgCu), tin-bismuth (SnBi), or SnAg, and the like may be used.

Alternatively or additionally, when the conductive adhesive is used, a conductive adhesive, such as an anisotropic conductive film (ACF) and an anisotropic conductive paste (ACP), may be disposed between the two components and pressure may be applied to allow current to flow in a direction in which the pressure is applied.

Alternatively or additionally, a gate signal or a data signal may be transmitted to adjacent micro pixel controllers 130. For example, the gate signal may be sequentially transmitted to the micro pixel controllers 130 adjacent to each other in a row direction, and the data signal may be sequentially transmitted to the micro pixel controllers 130 adjacent to each other in a column direction. As described above, since signals are sequentially transmitted between the micro pixel controllers 130, the line structure may be simplified. The timing control signal may also be transmitted to adjacent micro pixel controllers 130.

Figure 7:
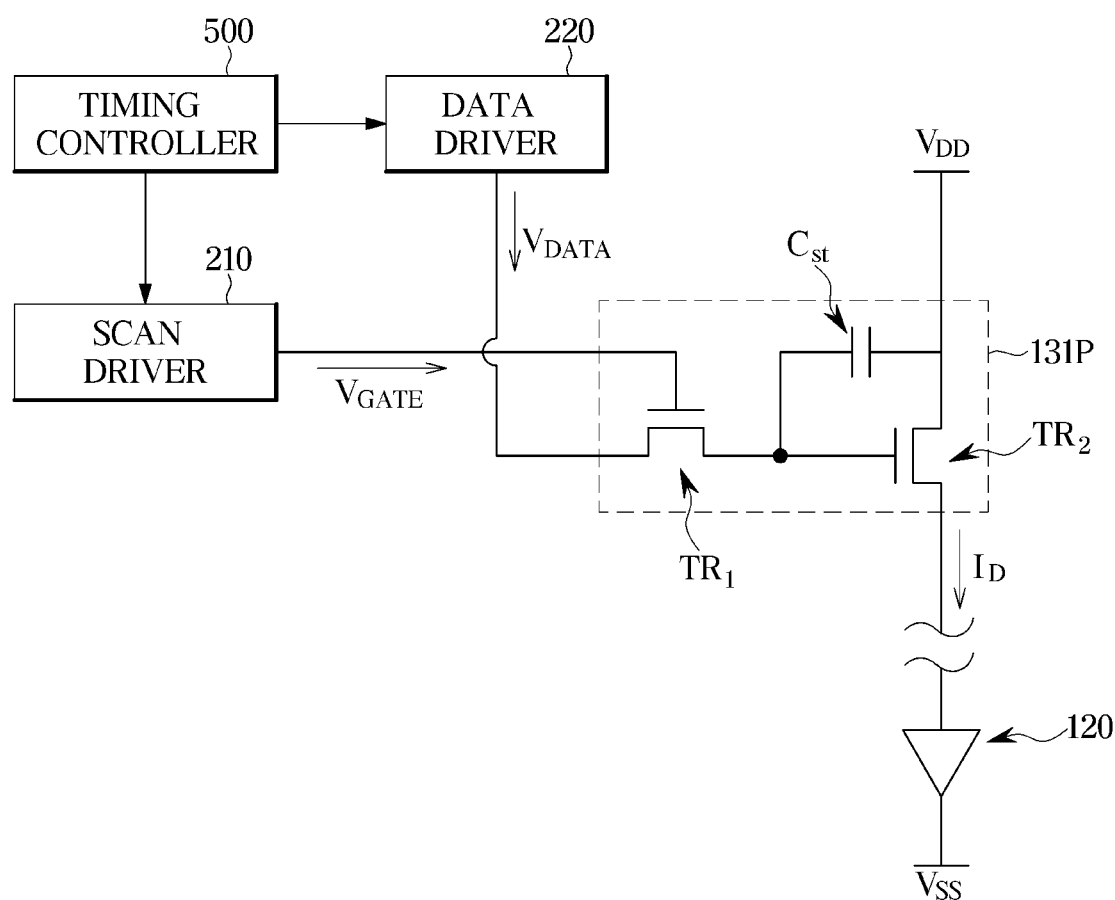
FIG. 7 is a diagram schematically illustrating a basic circuit structure necessary for the micro pixel controller to supply a driving current to the pixel in the display module, according to one or more embodiments.
Figure 8:
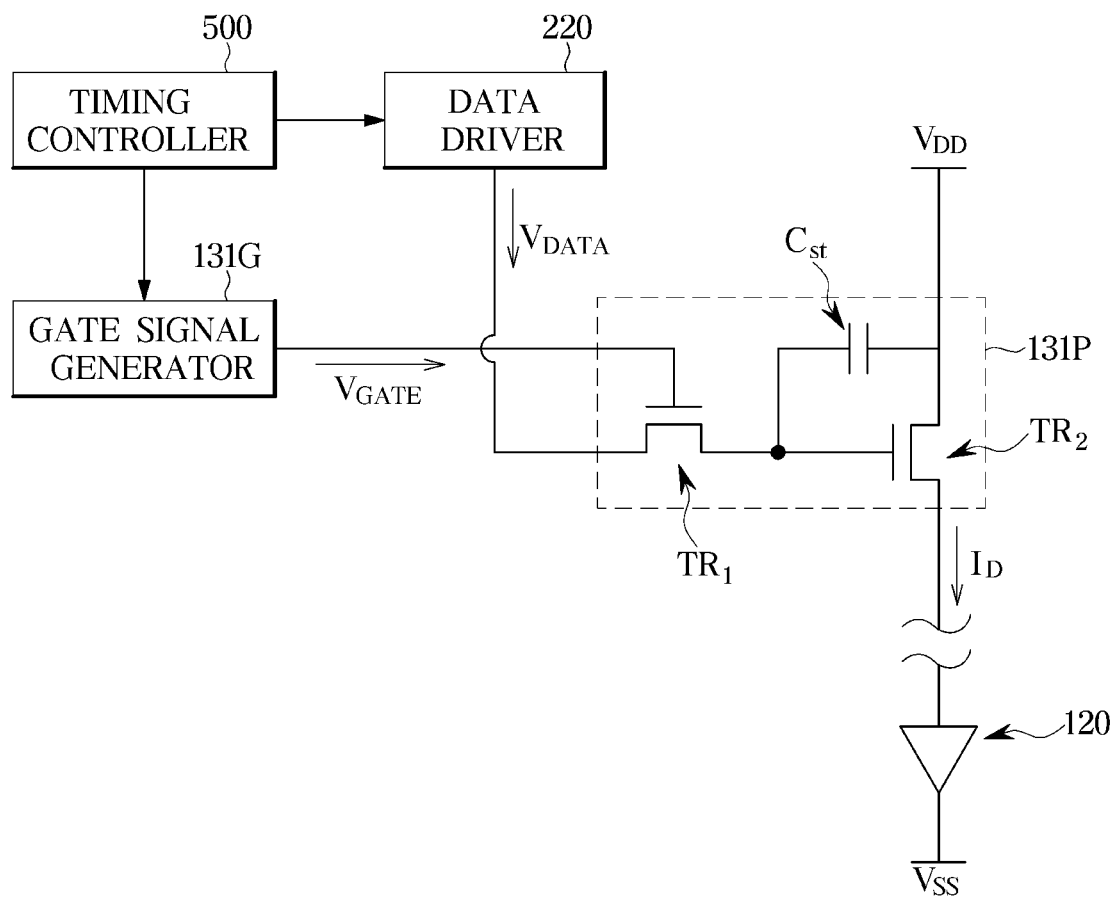
FIG. 8 is a diagram schematically illustrating a basic circuit structure necessary for the micro pixel controller to supply a driving current to the pixel in the display module, according to one or more embodiments.

FIGS. 7 and 8 are diagrams schematically illustrating a basic circuit structure necessary for the micro pixel controller 130 to supply the driving current to the pixel P in the display module 10 according to one or more embodiments.

Referring to FIG. 7, the driver IC 200 may include a scan driver 210 and a data driver 220. The scan driver 210 may output the gate signal for turning the sub-pixel on/off, and the data driver 220 may output the data signal for implementing an image.

The scan driver 210 may generate the gate signal based on the timing control signal transmitted from the timing controller 500, and the data driver 220 may generate the data signal based on the image data transmitted from the timing controller 500. The gate signal may have a gate voltage for turning the sub-pixel on, and the data signal may have a data voltage that expresses a grayscale of the image.

In some embodiments, according to various design changes, some of the operations of the driver IC 200 may be performed by the micro pixel controller 130. For example, the operation of the scan driver 210 may be performed by the micro pixel controller 130, and in this case, as shown in FIG. 8, a gate signal generator 131G may be included in the micro pixel controller 130. When the gate signal is generated by the micro pixel controller 130 as described above, since the scan driver 210 and lines for connection with the scan driver 210 may be omitted, the complexity of a line structure of the display module 10 or the display apparatus 1 may be reduced, and accordingly, a volume of the display module 10 or the display apparatus 1 may also be reduced, so that a bezel-less screen may be implemented by reducing a side surface line region.

The timing control signal output from the timing controller 500 may be input to the gate signal generator 131G of the micro pixel controller 130, and the gate signal generator 131G may generate a gate signal for turning a switching transistor $TR_1$ of a pixel driving circuit 131P on/off based on the input timing control signal.

Alternatively or additionally, the timing control signal output from the timing controller 500 may be input to the pixel driving circuit 131P of the micro pixel controller 130 to turn the switching transistor $TR_1$ of the pixel driving circuit 131P off so that the blanking period is generated, thereby turning the inorganic light-emitting element 120 off. Alternatively or additionally, according to one or more embodiments, the timing control signal output from the timing controller 500 may be input to a control circuit of the micro pixel controller 130 so that the blanking period is generated, and the control circuit may transmit the driving signal to the pixel driving circuit 131P to turn the switching transistor $TR_1$ of the pixel driving circuit 131P off.

The micro pixel controller 130 may include the pixel driving circuit 131P for individually controlling each inorganic light-emitting element 120, and the gate signal output from the scan driver 210 or the gate signal generator 131G and the data signal output from the data driver 220 may be input to the pixel driving circuit 131P.

Alternatively or additionally, the gate signal or the data signal may be transmitted to adjacent micro pixel controllers 130. For example, the gate signal may be sequentially transmitted to the micro pixel controllers 130 adjacent to each other in the row direction, and the data signal may be sequentially transmitted to the micro pixel controllers 130 adjacent to each other in the column direction. As such, since signals are sequentially transmitted between the micro pixel controllers 130, the line structure may be simplified.

When a gate voltage $V_{GATE}$, a data voltage $V_{DATA}$, and a power supply voltage $V_{DD}$ are input to the pixel driving circuit 131P, the pixel driving circuit 131P may output a driving current $I_D$ for driving the inorganic light-emitting element 120.

The driving current $I_D$ output from the pixel driving circuit 131P may be input to the inorganic light-emitting element 120, and the inorganic light-emitting element 120 may emit light due to the input driving current $I_D$ to implement an image.

For example, the pixel driving circuit 131P may include thin-film transistors $TR_1$ and $TR_2$ configured to switch or drive the inorganic light-emitting element 120 and a capacitor $C_{st}$. As described above, the inorganic light-emitting element 120 may be a micro-LED.

For example, the thin-film transistors $TR_1$ and $TR_2$ may include the switching transistor $TR_1$ and a driving transistor $TR_2$, and the switching transistor $TR_1$ and the driving transistor $TR_2$ may be implemented as P-type metal oxide semiconductor (PMOS) type transistors. However, the embodiments of the display module 10 and the display apparatus 1 are not limited thereto, and the switching transistor $TR_1$ and the driving transistor $TR_2$ may be implemented as N-type metal oxide semiconductor (NMOS) type transistors.

The switching transistor $TR_1$ has a gate electrode to which the gate voltage $V_{GATE}$ is input, a source electrode to which the data voltage $V_{DATA}$ is input, and a drain electrode that is connected to one end of the capacitor $C_{st}$ and a gate electrode of the driving transistor $TR_2$.

Alternatively or additionally, the driving transistor $TR_2$ has a source electrode to which the power supply voltage $V_{DD}$ is applied and a drain electrode that is connected to an anode of the inorganic light-emitting element 120. A reference voltage $V_{SS}$ may be applied to a cathode of the inorganic light-emitting element 120. The reference voltage $V_{SS}$ may be a voltage lower than the power supply voltage $V_{DD}$, and a ground voltage or the like may be used as the reference voltage $V_{SS}$ to provide a ground.

The pixel driving circuit 131P of the above-described structure may operate as described below. First, when the gate voltage $V_{GATE}$ is applied and the switching transistor $TR_1$ is turned on, the data voltage $V_{DATA}$ may be transmitted to one end of the capacitor $C_{st}$ and the gate electrode of the driving transistor $TR_2$.

A voltage corresponding to a gate-source voltage $V_{GS}$ of the driving transistor $TR_2$ may be maintained for a predetermined time due to the capacitor $C_{st}$. The driving transistor $TR_2$ may apply the driving current $I_D$ corresponding to the gate-source voltage $V_{GS}$ to the anode of the inorganic light-emitting element 120, thereby causing the inorganic light-emitting element 120 to emit light.

The brightness of the inorganic light-emitting element 120 may vary depending on a magnitude of the driving current, that is, an amplitude of the driving current, and the brightness may be differently expressed according to an emission duration of the inorganic light-emitting element 120 even when a driving current of the same magnitude is applied.

The display module 10, according to one embodiments, may control the inorganic light-emitting element 120 by combining pulse amplitude modulation (PAM) control for controlling the amplitude of the driving current and pulse width modulation (PWM) control for controlling a pulse width of the driving current.

Alternatively or additionally, in the blanking period in which the inorganic light-emitting element 120 does not emit light, at least one of the switching transistor $TR_1$ and the driving transistor $TR_2$ is turned off, so that the driving current $I_D$ may not be supplied to the inorganic light-emitting element 120.

Figure 9:
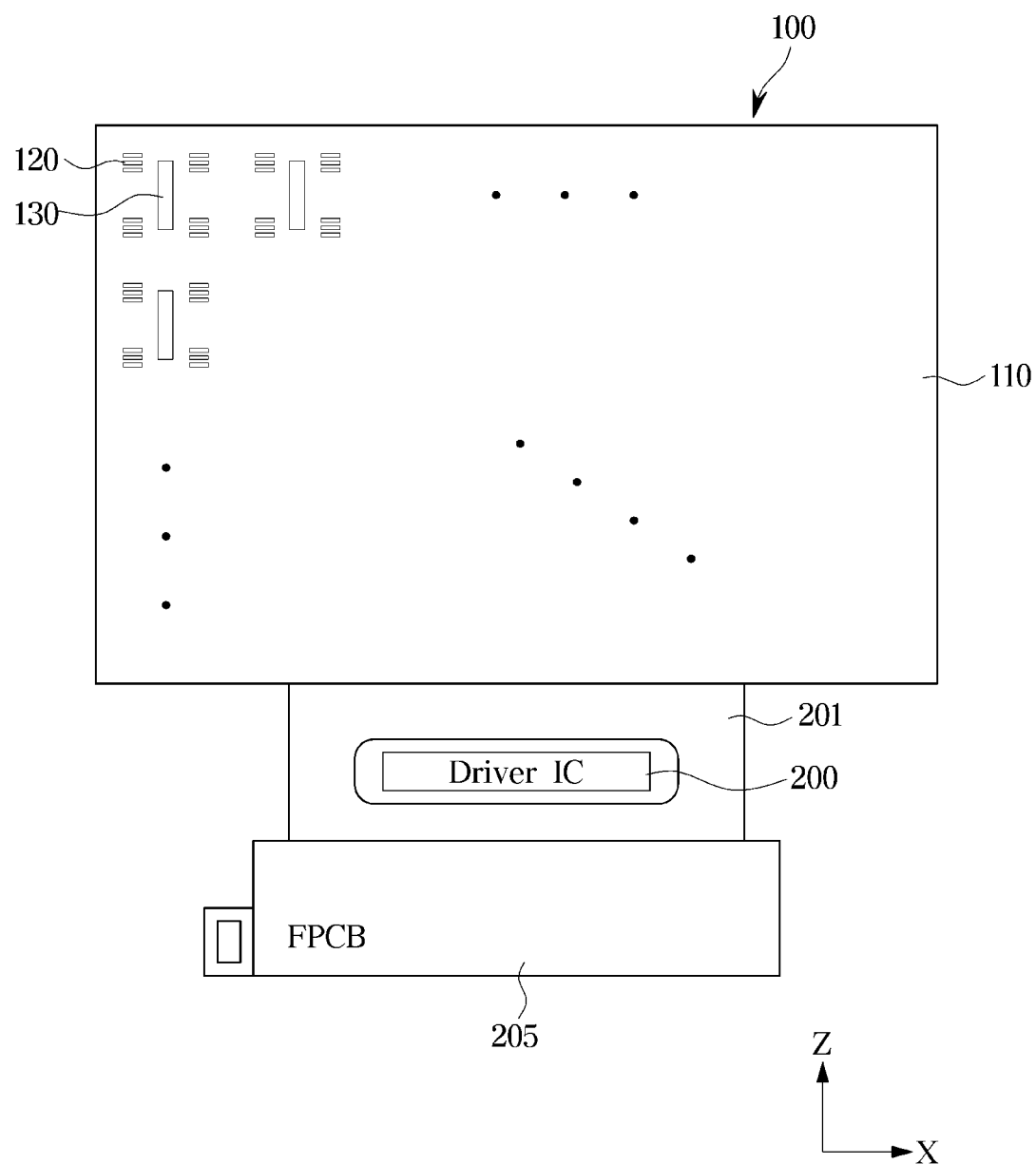
FIG. 9 is a diagram illustrating an example of a method of electrically connecting a display panel and a driver integrated circuit (IC) in the display module, according to one or more embodiments.

FIG. 9 is a diagram illustrating an example of a method of electrically connecting the display panel 100 and the driver IC 200 in the display module 10 according to one or more embodiments.

The driver IC 200 may be electrically connected to the display panel 100 by employing one of various bonding methods such as chip-on-film (COF) or film-on-glass (FOG) bonding, chip-on-glass (COG) bonding, and tape-automated bonding (TAB).

For example, when the COF bonding is employed, as shown in FIG. 9, the driver IC 200 is mounted on a film 201, and one end of the film 201 on which the driver IC 200 is mounted may be electrically connected to the module substrate 110 and the other end thereof may be electrically connected to a flexible printed circuit board (FPCB) 205.

The signal supplied from the driver IC 200 may be transmitted to the micro pixel controller 130 through a side surface line or a via hole line formed on the module substrate 110.

The plurality of pixel driving circuits 131P may be formed on an IC substrate (not shown). The IC substrate may be implemented as one of substrates of various materials such as a silicon substrate, a glass substrate, a plastic substrate, a PCB, an FPCB, and a cavity substrate. Since there is no heat source, such as the inorganic light-emitting element, in the micro pixel controller 130, the type of substrate may be selected without limitation according to the heat resistance of the material.

The thin-film transistor (TFT) formed on the IC substrate may be a low-temperature polycrystalline silicon (LTPS) TFT or an oxide TFT. Alternatively or additionally, the TFT may also be an amorphous silicon (a-Si) TFT or a single crystal TFT.

For example, in the case of the LTPS TFT, electron mobility may vary depending on a material of the substrate on which the TFT is formed. A silicon substrate does not have restrictions on electron mobility as compared with a glass substrate, and thus when the IC substrate is implemented as a silicon substrate, the performance of the LTPS TFT may be improved. In some embodiments, since the inorganic light-emitting element 120, which is a heat source, is transferred to the module substrate 110 rather than the IC substrate, the IC substrate may be implemented as a silicon substrate without limitation due to heat resistance.

Alternatively or additionally, the module substrate 110 to which the inorganic light-emitting elements 120 are transferred may also be implemented as one of substrates of various materials such as a silicon substrate, a glass substrate, a plastic substrate, a PCB, an FPCB, and a cavity substrate.

On the module substrate 110, circuit elements such as a TFT other than electrode pads and lines do not have to be formed. Thus, since other restrictions such as TFT performance do not have to be considered in selecting the type of module substrate 110, the module substrate 110 may be implemented as a glass substrate having excellent durability against the heat generated by the inorganic light-emitting element 120.

Alternatively or additionally, since circuit elements such as a TFT are not provided on the module substrate 110, the circuit elements may be prevented from being damaged in a cutting process of the module substrate 110 and a line formation process, or a replacement process of the inorganic light-emitting element 120, and the difficulty of a manufacturing process of the display module 10 may be reduced.

Alternatively or additionally, before transferring the micro pixel controllers 130 to the module substrate 110, circuit inspection may be performed individually for each micro pixel controller 130, and the micro pixel controller 130 determined as a good product by the circuit inspection may be mounted in the display module 10. Accordingly, in comparison with a case in which a TFT circuit is directly mounted on the module substrate, the circuit may be easily inspected and defective products may be easily replaced.

Figure 10:
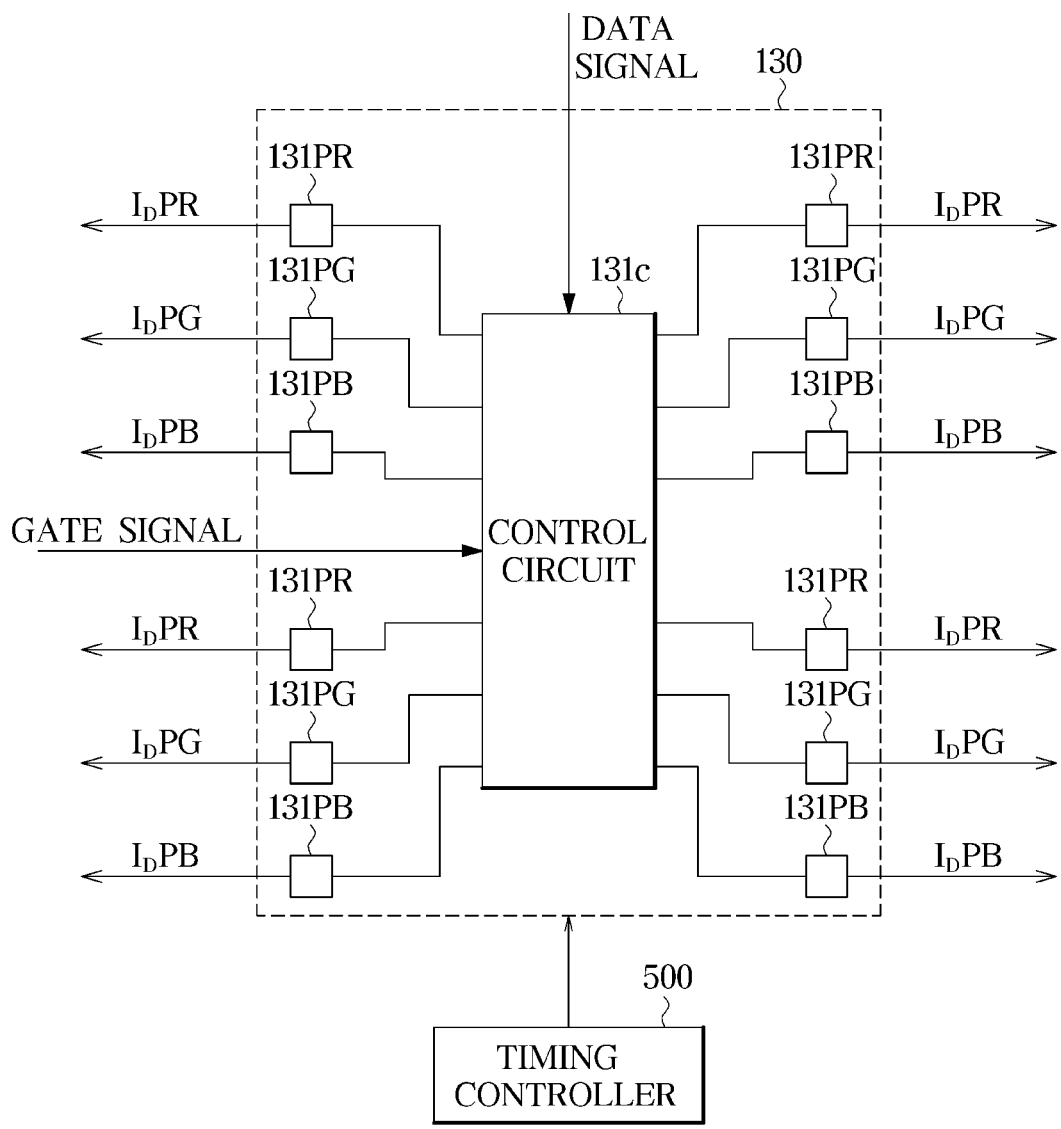
FIG. 10 is a control block diagram illustrating a configuration of the micro pixel controller in the display module, according to one or more embodiments.

FIG. 10 is a control block diagram illustrating a configuration of the micro pixel controller 130 in the display module 10 according to one or more embodiments.

Referring to FIG. 10, the micro pixel controller 130 may include the above-described pixel driving circuit 131P, and the pixel driving circuit 131P may be provided in a quantity corresponding to the number of the pixels P controlled by the micro pixel controller 130, that is, the number of the inorganic light-emitting elements 120.

For example, when one micro pixel controller 130 controls the pixels of a 2×2 array, the micro pixel controller 130 may include a pixel driving circuit 131PR, a pixel driving circuit 131PG, and a pixel driving circuit 131PB for respectively driving a red inorganic light-emitting element 120R, a green inorganic light-emitting element 120G, and a blue inorganic light-emitting element 120B that are included in each of the four pixels.

A driving current $I_D PR$ output from the red pixel driving circuit 131PR may be input to the red inorganic light-emitting element 120R, a driving current $I_D PG$ output from the green pixel driving circuit 131PG may be input to the green inorganic light-emitting element 120G, and a driving current $I_D PB$ output from the blue pixel driving circuit 131PB may be input to the blue inorganic light-emitting element 120B.

Alternatively or additionally, the micro pixel controller 130 may include a control circuit 131c for distributing an input signal to each pixel driving circuit 131P. When the gate signal and the data signal are input, the control circuit 131c may distribute the input gate signal and data signal to each pixel driving circuit 131P according to control logic. To this end, the control circuit 131c may include a multiplexer and/or demultiplexer, and the control logic may be determined by the timing control signal.

As described above, the display module 10, according to one or more embodiments, may apply PWM control in controlling the brightness of the inorganic light-emitting element 120 and may use a slope waveform for the PWM control.

Alternatively or additionally, the micro pixel controller 130 may receive the timing control signal from the timing controller 500 and may generate the blanking period on the basis of the timing control signal received from the timing controller 500.

The micro pixel controller 130 may switch the inorganic light-emitting element 120 so that the blanking period is periodically generated when the frame rate is changed. That is, the micro pixel controller 130 may switch the inorganic light-emitting element 120 so that a period of the blanking period before the frame rate is changed and a period of the blanking period after the frame rate is changed are the same.

For example, when the frame rate is changed, the timing controller 500 may transmit a timing control signal for periodically generating the blanking period to the plurality of micro pixel controllers 130 of each of the plurality of display modules 10 (e.g., display modules 10-1, 10-2, . . . , and 10-n of FIGS. 3 and 4). In such an example, when the timing control signal for periodically generating the blanking period is received from the timing controller 500, the micro pixel controller 130 may transmit the timing control signal to the micro pixel controller 130 located in an adjacent row or column. That is, the timing controller 500 may transmit the timing control signal for periodically generating the blanking period to the plurality of micro pixel controllers 130 of each of the plurality of display modules 10 by transmitting the timing control signal to a first micro pixel controller 130 (e.g., the micro pixel controller 130 located in the uppermost row) among the plurality of micro pixel controllers 130 included in the display apparatus 1 and allowing a second micro pixel controller 130 other than the first micro pixel controller 130 among the plurality of micro pixel controllers 130 to receive the timing control signal from the adjacent micro pixel controller 130.

For example, when the frame rate is changed, the timing controller 500 may transmit a driving signal for periodically generating the blanking period to the pixel driving circuit 131P of each of the plurality of micro pixel controllers 130, according to some embodiments.

As shown in FIG. 10, the timing controller 500 may transmit the driving signal for periodically generating the blanking period to the plurality of pixel driving circuits 131PR, 131PG, and 131PB included in the micro pixel controller 130.

When the driving signal for periodically generating the blanking period is received, the pixel driving circuit 131P may switch the inorganic light-emitting element 120 so that the blanking period is generated at the same period. That is, the pixel driving circuit 131P turns at least one of the switching transistor $TR_1$ and the driving transistor $TR_2$ off at a constant time interval to cut off the supply of the driving current $I_D$ to the inorganic light-emitting element 120, thereby periodically turning the inorganic light-emitting element 120 off.

Alternatively or additionally, according to some embodiments, when the frame rate is changed, the timing controller 500 may transmit a trigger signal for periodically generating the blanking period to the control circuit 131c of each of the plurality of micro pixel controllers 130.

When the trigger signal is received, the control circuit 131c may transmit the driving signal for periodically generating the blanking period to the plurality of pixel driving circuits 131PR, 131PG, and 131PB.

When the driving signal for periodically generating the blanking period is received, the pixel driving circuit 131P may switch the inorganic light-emitting element 120 so that the blanking period is generated at the same period. That is, the pixel driving circuit 131P turns at least one of the switching transistor $TR_1$ and the driving transistor $TR_2$ off at a constant time interval to cut off the supply of the driving current $I_D$ to the inorganic light-emitting element 120, thereby periodically turning the inorganic light-emitting element 120 off.

The operation of each configuration included in the display apparatus 1 has been described above in detail. Hereinafter, a method of controlling the blanking period according to a change in frame rate will be described in detail.

Figure 11:
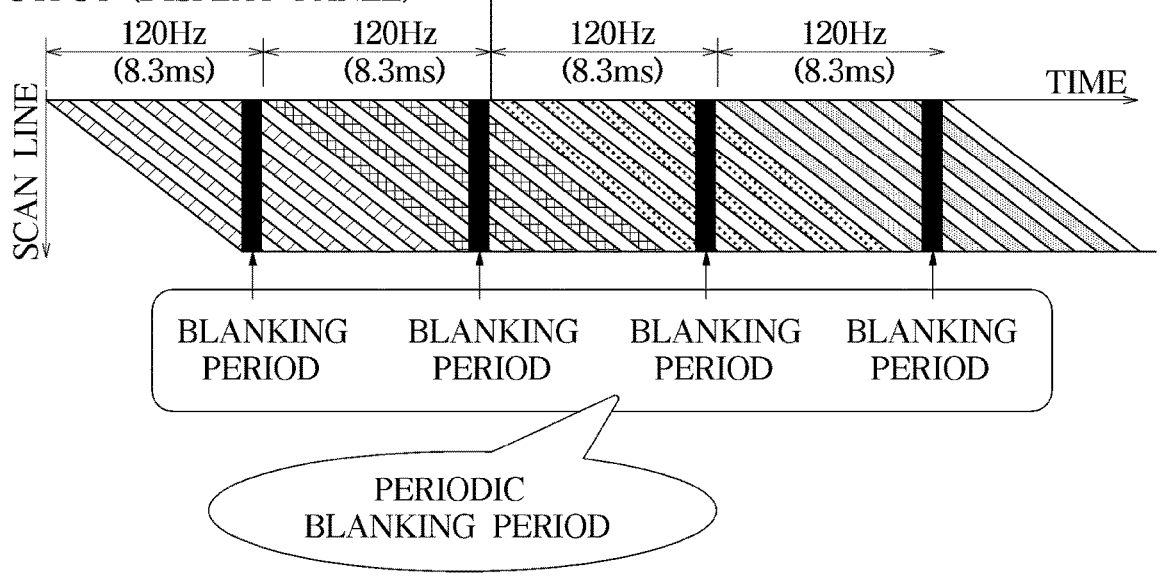
FIG. 11 illustrates a blanking period in a case in which the display apparatus, according to one or more embodiments, displays image data at a constant frame rate.
Figure 12:
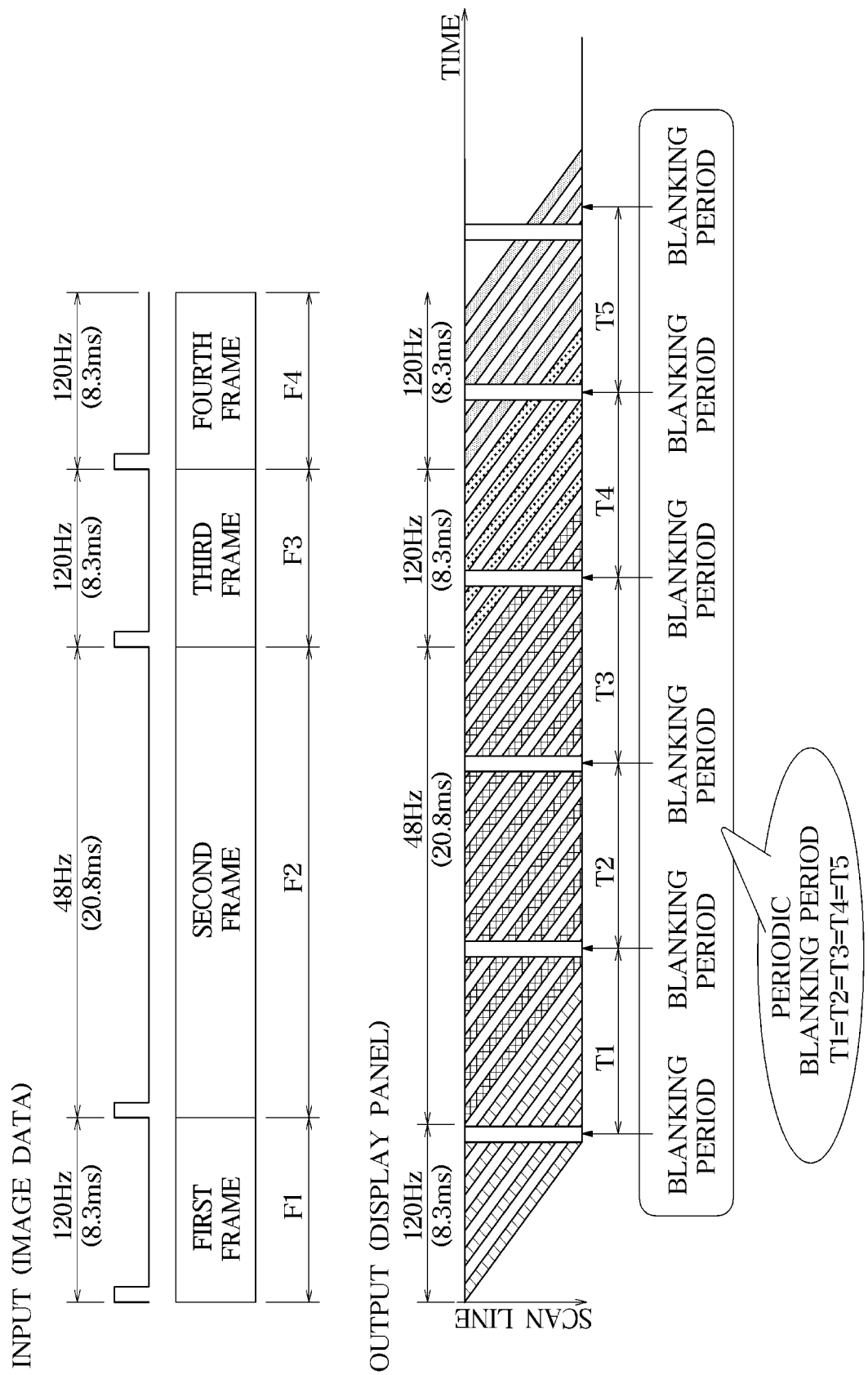
FIG. 12 illustrates the blanking period in a case in which the display apparatus, according to one or more embodiments displays the image data by changing the frame rate.

FIG. 11 illustrates the blanking period in a case in which the display apparatus 1, according to one or more embodiments, displays image data at a constant frame rate, and FIG. 12 illustrates the blanking period in a case in which the display apparatus 1, according to one or more embodiments, displays the image data by changing the frame rate.

Referring to FIG. 11, the display apparatus 1, according to one or more embodiments, may control the display panel 100 of each of the plurality of display modules 10 to generate one blanking period per frame when the frame rate is constant.

In some embodiments, the blanking period refers to a period in which the entire screen of the display apparatus 1 is turned off by momentarily turning off each of the inorganic light-emitting elements 120 included in the display apparatus 1, and the inorganic light-emitting element 120 does not emit light since the driving current is not supplied to each of the inorganic light-emitting elements 120 during the blanking period. The display apparatus 1 may determine whether an overcurrent, which may occur during a cell crack, is detected on the basis of the fact that the driving current is not supplied to the inorganic light-emitting element 120 during the blanking period.

For example, when the display apparatus 1 controls such that one blanking period is generated per one programming scan, the display apparatus 1 may control the display panel 100 such that the blanking period is generated at the same time point (e.g., directly before the end of the frame) in each of frames F1, F2, F3, and F4. That is, the display apparatus 1 may generate the blanking period that is repeated at a period corresponding to one frame size (e.g., 8.3 milliseconds (ms)).

Accordingly, the display panel 100 of each of the plurality of display modules 10 included in the display apparatus 1 may generate the blanking period, in which light is not emitted, periodically.

The display apparatus 1, according to one or more embodiments, may change the frame rate to correspond to the source signal. That is, when the main controller 300 processes the source signal to generate the image data, the main controller 300 may change the frame rate to correspond to a frame rate of the source signal.

For example, when a command for changing from the first mode, in which the frame rate is fixed, to the second mode, in which the frame rate is varied according to the source signal, is received, the display apparatus 1 may change the frame rate.

In this case, when one blanking period is generated at the same time (e.g., directly before the end of the frame) in each of the frames F1, F2, F3, and F4, as in the case where the frame rate is fixed, the blanking period is aperiodically generated, and the user may recognize the aperiodic blanking period as a flicker phenomenon.

For example, when one blanking period is generated at the same time point (e.g., directly before the end of the frame) in each of the frames F1, F2, F3, and F4 in a state in which the frame rate of a second frame F2 is changed to 48 Hz unlike the other frames F1, F3, and F4, an interval between the blanking period of a first frame F1 and the blanking period of the second frame F2 is different from an interval between the blanking period of the second frame F2 and the blanking period of a third frame F3, and thus the blanking period may be seen as being generated aperiodically.

As shown in FIG. 12, the display apparatus 1, according to one or more embodiments, may control the display panel 100 of each of the plurality of display modules 10 to generate the blanking period at a constant period even when the frame rate is changed.

For example, when the frame rate of the second frame F2 is changed to 48 Hz unlike the other frames F1, F3, and F4, the display apparatus 1 may add the blanking period to the second frame F2 so that a period of the blanking period may be maintained at 8.3 ms, which is the period before the frame rate is changed. Consequently, the period of the blanking period before the frame rate is changed and the period of the blanking period after the frame rate is changed may be the same.

As such, the display apparatus 1, according to one or more embodiments, allows the blanking period to be generated at a constant period even when the frame rate is changed, thereby preventing the user from recognizing a flickering phenomenon.

The case in which the blanking period is periodically generated in the display apparatus 1 has been described in detail above. Hereinafter, a case in which the control signal for periodically generating the blanking period is transmitted and received in the display apparatus 1 will be described in detail.

Figure 13:
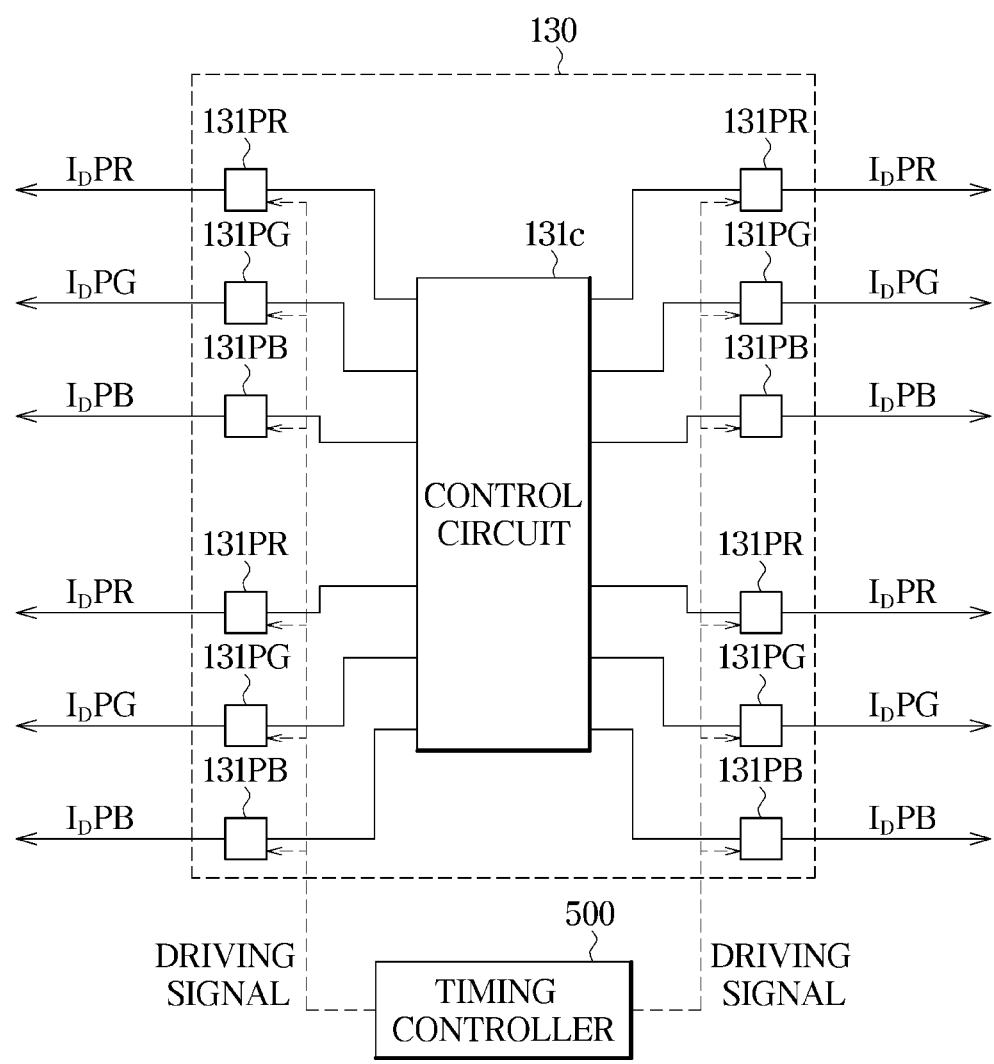
FIG. 13 is a diagram in a case in which a timing controller of the display apparatus, according to one or more embodiments, transmits a driving signal for a periodic blanking period to a pixel driving circuit of the micro pixel controller.
Figure 14:
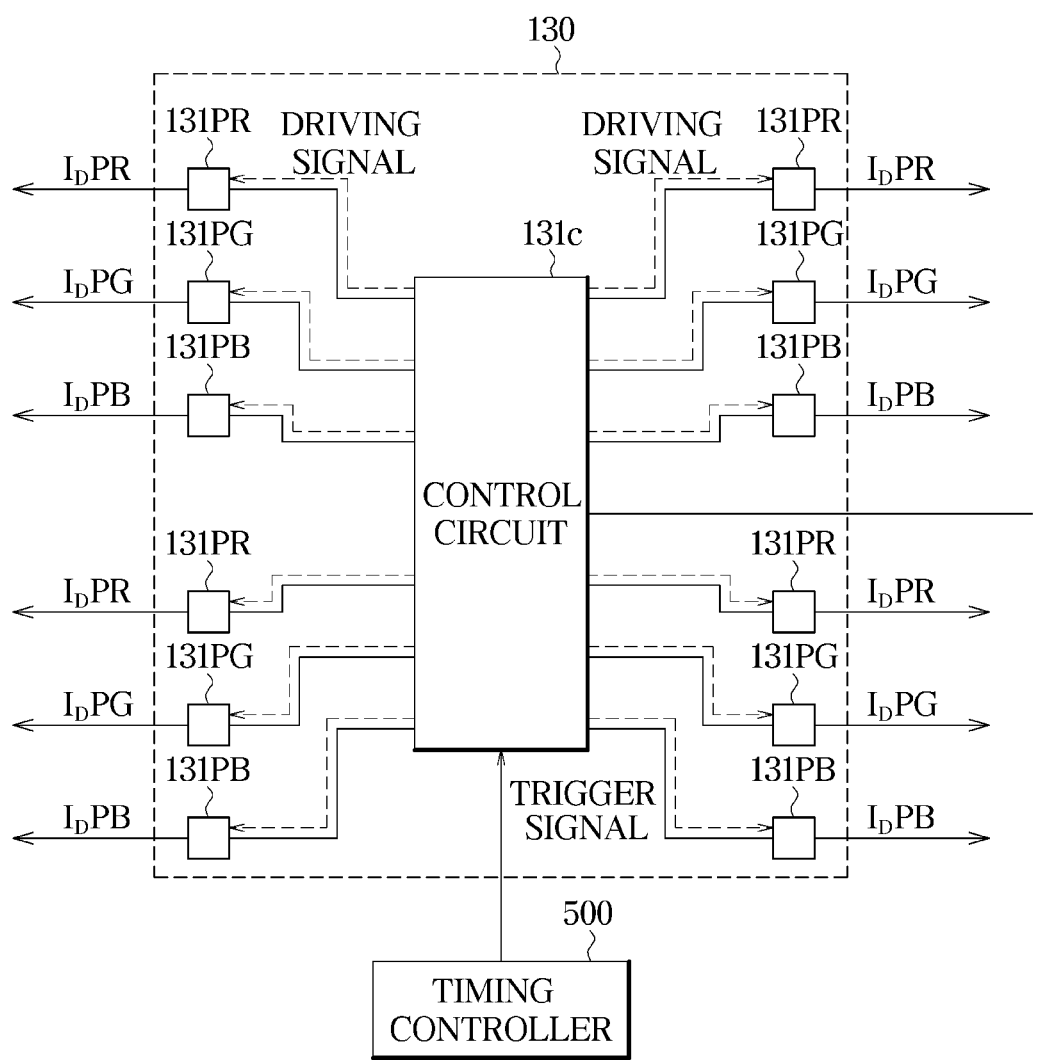
FIG. 14 is a diagram in a case in which the timing controller of the display apparatus, according to one or more embodiments, transmits a trigger signal for the periodic blanking period to a control circuit of the micro pixel controller.

FIG. 13 is a diagram in a case in which the timing controller 500 of the display apparatus 1, according to one or more embodiments, transmits the driving signal for the periodic blanking period to the pixel driving circuit 130P of the micro pixel controller 130, and FIG. 14 is a diagram in a case in which the timing controller 500 of the display apparatus 1, according to one or more embodiments, transmits the trigger signal for the periodic blanking period to the control circuit 131c of the micro pixel controller 130.

The display apparatus 1, according to one or more embodiments, allows the blanking period to be periodically generated even when the frame rate is changed.

That is, when the frame rate is changed, each of the plurality of micro pixel controllers 130 included in the display apparatus 1 may switch the plurality of inorganic light-emitting elements 120 constituting two or more pixels electrically connected thereto so that the blanking period is periodically generated. For example, the micro pixel controller 130 may switch the plurality of inorganic light-emitting elements 120 constituting two or more pixels electrically connected thereto so that a period of the blanking period before the frame rate is changed and a period of the blanking period after the frame rate is changed are the same.

For example, as shown in FIGS. 13 and 14, when the micro pixel controller 130 is electrically connected to four pixels P, the micro pixel controller 130 periodically stops supplying the driving current $I_D$ to the inorganic light-emitting elements 120 constituting each pixel so that the blanking period is periodically generated.

In such an example, when the frame rate is changed, the timing controller 500 may transmit the timing control signal for periodically generating the blanking period to the plurality of micro pixel controllers 130 of each of the plurality of display modules 10.

In such an example, when the driving signal for periodically generating the blanking period is received from the timing controller 500, the micro pixel controller 130 may transmit the timing control signal to the micro pixel controller 130 located in an adjacent row or column.

That is, the timing controller 500 may transmit the timing control signal for periodically generating the blanking period to the plurality of micro pixel controllers 130 of each of the plurality of display modules 10 by transmitting the timing control signal to a first micro pixel controller 130 (e.g., the micro pixel controller 130 located in the uppermost row) among the plurality of micro pixel controllers 130 included in the display apparatus 1 and allowing a second micro pixel controller 130 other than the first micro pixel controller 130 among the plurality of micro pixel controllers 130 to receive the timing control signal from the adjacent micro pixel controller 130.

For example, as shown in FIG. 13, when the frame rate is changed, the timing controller 500 may transmit the driving signal for periodically generating the blanking period to the pixel driving circuit 131P of each of the plurality of micro pixel controllers 130, according to some embodiments.

As shown in FIG. 13, the timing controller 500 may transmit the driving signal for periodically generating the blanking period to the plurality of pixel driving circuits 131PR, 131PG, and 131PB included in the micro pixel controller 130.

When the driving signal for periodically generating the blanking period is received, the pixel driving circuit 131P may switch the inorganic light-emitting element 120 so that the blanking period is generated at the same period.

That is, the pixel driving circuit 131P may periodically cut off the driving current $I_D$ supplied to the plurality of inorganic light-emitting elements 120 constituting two or more pixels electrically connected thereto on the basis of the driving signal received from the timing controller 500. For example, the pixel driving circuit 131P turns at least one of the switching transistor $TR_1$ and the driving transistor $TR_2$ off at a constant time interval to cut off the supply of the driving current $I_D$ to the inorganic light-emitting element 120, thereby periodically turning the inorganic light-emitting element 120 off.

Alternatively or additionally, according to some embodiments, as shown in FIG. 14, when the frame rate is changed, the timing controller 500 may transmit the trigger signal for periodically generating the blanking period to the control circuit 131c of each of the plurality of micro pixel controllers 130.

When the trigger signal is received, the control circuit 131c may transmit the driving signal for periodically generating the blanking period to the plurality of pixel driving circuits 131PR, 131PG, and 131PB.

When the driving signal for periodically generating the blanking period is received, the pixel driving circuit 131P may switch the inorganic light-emitting element 120 so that the blanking period is generated at the same period.

That is, the pixel driving circuit 131P may periodically cut off the driving current $I_D$ supplied to the plurality of inorganic light-emitting elements 120 constituting two or more pixels electrically connected thereto on the basis of the driving signal received from the timing controller 500. For example, the pixel driving circuit 131P turns at least one of the switching transistor $TR_1$ and the driving transistor $TR_2$ off at a constant time interval to cut off the supply of the driving current $I_D$ to the inorganic light-emitting element 120, thereby periodically turning the inorganic light-emitting element 120 off.

As described above, when the frame rate is changed, the timing controller 500 transmits the driving signal for generating a periodic blanking period to the pixel driving circuit 131P of the micro pixel controller 130, or transmits the trigger signal instructing the driving signal to be transmitted to the pixel driving circuit 131P to the control circuit 131c of the micro pixel controller 130, thereby periodically generating the blanking period regardless of the change in frame rate. Accordingly, the display apparatus 1, according to one or more embodiments, may prevent a flicker phenomenon that may occur due to the aperiodic blanking period generated according to a change in frame rate.

The method of controlling the blanking period according to the change in frame rate has been described in detail above. Hereinafter, a configuration in which a signal is transmitted to the plurality of display modules 10 in the display apparatus 1 will be described in detail.

Figure 15:
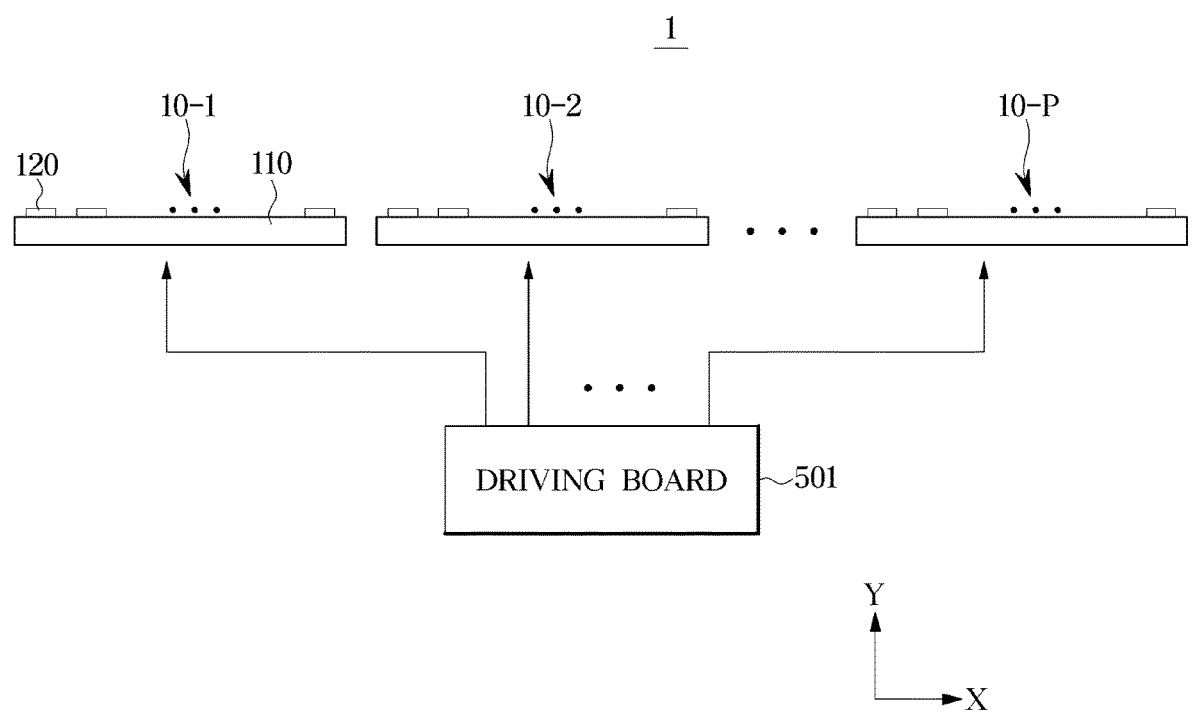
FIG. 15 is a diagram illustrating first examples in which a signal is transmitted to a plurality of tiled display modules in the display apparatus, according to one or more embodiments.
Figure 16:
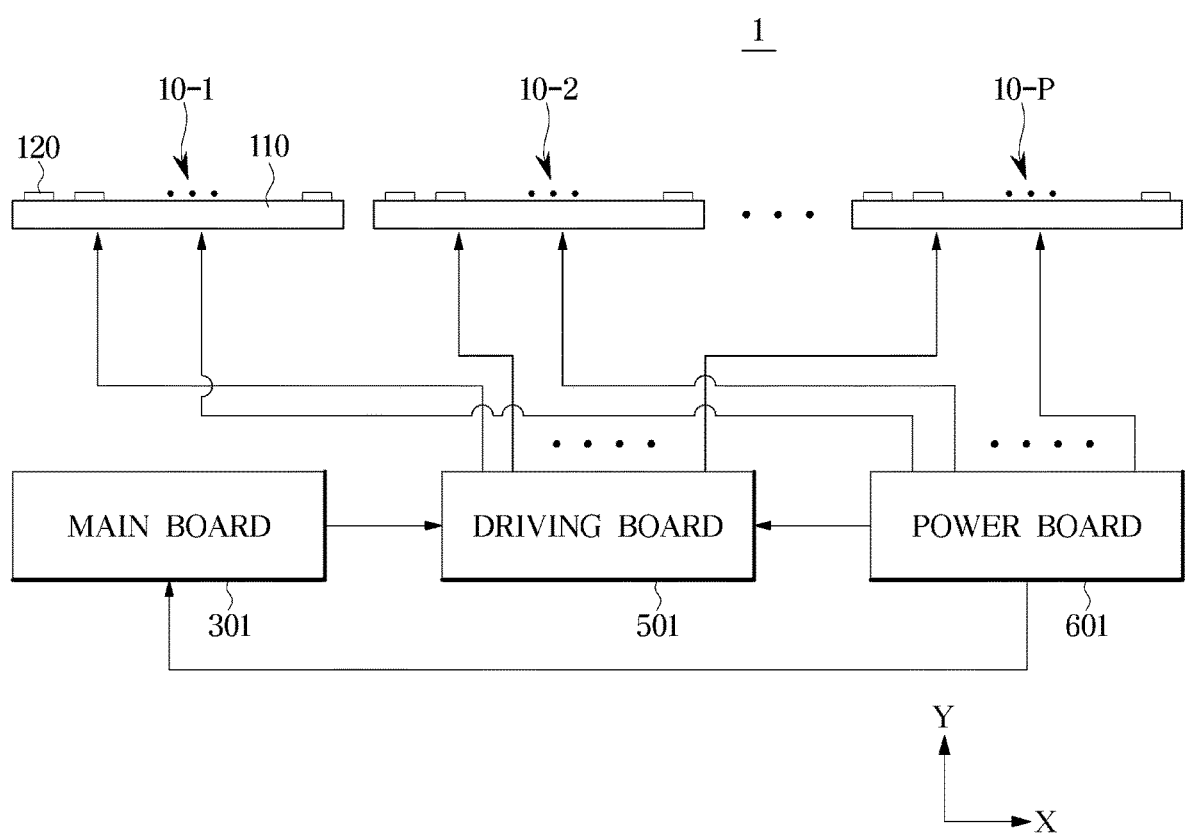
FIG. 16 is a diagram illustrating second examples in which a signal is transmitted to a plurality of tiled display modules in the display apparatus, according to one or more embodiments.

FIGS. 15 and 16 are diagrams illustrating an example of a signal transmitted to the plurality of tiled display modules 10 in the display apparatus 1 according to one or more embodiments.

As described above, the display apparatus 1 having a large-area screen may be implemented by tiling a plurality of display modules 10. FIGS. 15 and 16 are diagrams illustrating the display apparatus 1 on an XY plane and thus illustrate a one-dimensional arrangement of the display modules 10. Alternatively or additionally, the plurality of display modules 10 may be arranged two dimensionally as described above with reference to FIG. 1.

As described above, the display panel 100 may be connected to the FPCB 205 through the film 201 on which the driver IC 200 is mounted. The FPCB 205 may be connected to a driving board 501 to electrically connect the display module 10 to the driving board 501.

The timing controller 500 may be provided on the driving board 501. Accordingly, the driving board 501 may be referred to as a T-con board. The plurality of display modules 10 may receive image data, a timing control signal, and the like from the driving board 501.

Referring to FIG. 16, the display apparatus 1 may further include a main board 301 and a power board 601. The above-described main controller 300 may be provided on the main board 301, and a power supply circuit may be provided on the power board 601 to supply power to the plurality of display modules 10.

The power board 601 may be electrically connected to the plurality of display modules 10 through the FPCB 205, and may supply a power supply voltage $V_{DD}$, a reference voltage $V_{SS}$, and the like to the plurality of display modules 10 that are connected through the FPCB 205.

For example, the power supply voltage $V_{DD}$ supplied from the power board 601 may be applied to the micro pixel controller 130 through a side surface line or a via hole line formed on the module substrate 110. The reference voltage $V_{SS}$ supplied from the power board 601 may be applied to the micro pixel controller 130 or the inorganic light-emitting element 120 through the side surface line and the via hole line formed on the module substrate 110.

In the above-described example, the plurality of display modules 10 are described as sharing the driving board 501. In other embodiments, a separate driving board 501 may be connected to each individual display module 10. Alternatively or additionally, the plurality of display modules 10 may be grouped, and one driving board 501 may be connected to each group.

Figure 17:
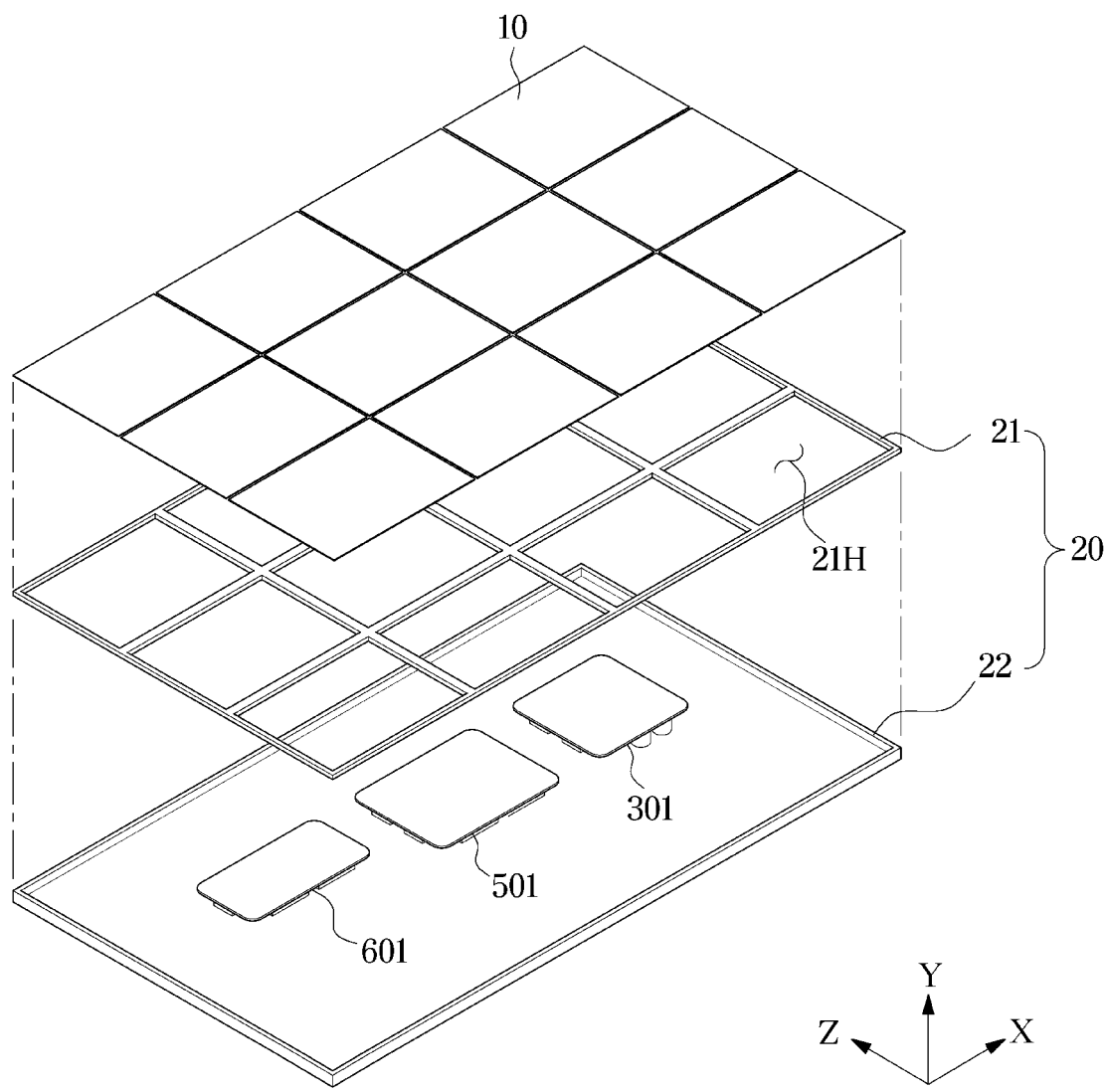
FIG. 17 is a view illustrating an example of a method in which the plurality of display modules are coupled to a housing in the display apparatus, according to one or more embodiments.

FIG. 17 is a view illustrating an example of a method in which the plurality of display modules 10 are coupled to the housing 20 in the display apparatus 1 according to one or more embodiments.

As described above, the plurality of display modules 10 may be arranged in the form of a two-dimensional matrix and fixed to the housing 20. Referring to the example of FIG. 17, the plurality of display modules 10 may be installed in a frame 21 located thereunder, and the frame 21 may have a two-dimensional mesh structure having an open partial region corresponding to the plurality of display modules 10.

For example, as many openings 21H as the number of the display modules 10 may be formed in the frame 21, and the openings 21H may have the same arrangement as the plurality of display modules 10.

An edge region of a lower surface of each of the plurality of display modules 10 may be mounted on the frame 21. The edge region of the lower surface may be a region in which a circuit element or line is not formed.

The plurality of display modules 10 may be mounted on the frame 21 through a method of using the magnetic force of a magnet, coupling by a mechanical structure, bonding by an adhesive, or the like. There is no limitation on the method in which the display module 10 is mounted on the frame 21.

The driving board 501, the main board 301, and the power board 601 may be disposed below the frame 21, and may be electrically connected to each of the plurality of display modules 10 through the openings 21H formed in the frame 21.

A lower cover 22 is coupled to a lower portion of the frame 21, and the lower cover 22 may form a lower exterior of the display apparatus 1.

In the above-described example, the case in which the display modules 10 are arranged two dimensionally was taken as an example. However, for example, the display modules 10 may be arranged in one dimension. In such an example, the structure of the frame 21 may also be transformed into a one-dimensional mesh structure.

Alternatively or additionally, the above-described shape of the frame 21 is merely an example applicable to some embodiments of the display apparatus 1, and the display modules 10 may be fixed by applying various shapes of frames 21.

The embodiments in which the inorganic light-emitting element 120 is switched through the micro pixel controller 130 mounted on the display panel 100 in the display apparatus 1 has been described above. Hereinafter, one or more embodiments in which the micro pixel controller 130 is not included in the display apparatus 1 and TFTs are mounted on the display panel 100 to switch the inorganic light-emitting elements 120 will be described in detail.

Figure 18:
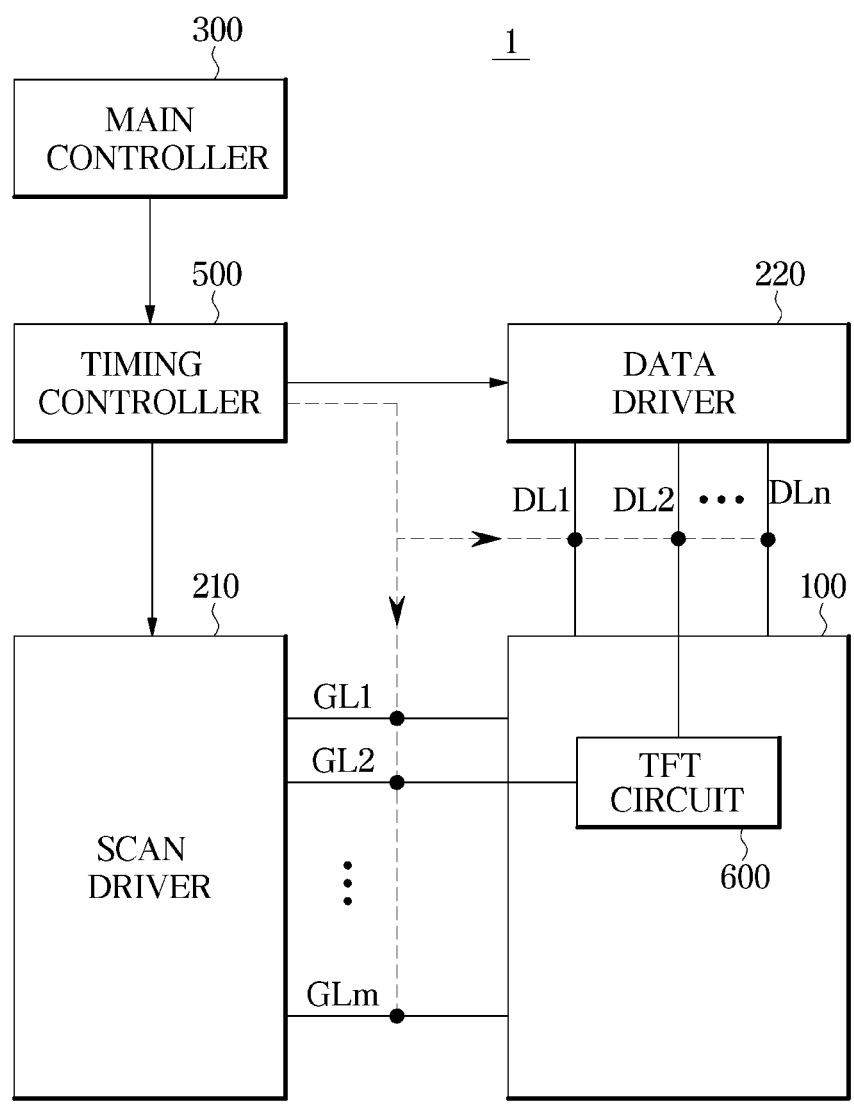
FIG. 18 is a schematic diagram of a case in which the display apparatus, according to one or more embodiments, is driven by a thin-film transistor (TFT) circuit mounted on a display panel.

FIG. 18 is a schematic diagram of a case in which a display apparatus 1, according to one or more embodiments, is driven by a TFT circuit mounted on a display panel 100.

Referring to FIG. 18, unlike the display apparatus 1, according to one or more embodiments, illustrated in FIGS. 1 to 17, the display apparatus 1 may include a TFT circuit 600 instead of the micro pixel controller 130.

For example, the display panel 100 includes a plurality of gate lines (e.g., gate lines $GL_1$, $GL_2$, $GL_3$, . . . , and $GL_m$, hereinafter gate lines GL) configured to transmit a gate signal, and a plurality of data lines (e.g., data lines $DL_1$, DL$_2$, DL$_3$, . . . , and DL$_n$, hereinafter data lines DL) formed to cross the plurality of gate lines GL and configured to transmit a data signal.

Alternatively or additionally, the display panel 100 includes a plurality of TFT circuits 600 in a matrix form, each of which includes a switching element formed in a region surrounded by the gate lines GL and the data lines DL and serving to switch between the gate lines GL and the data lines DL.

The TFT circuit 600 may supply a driving current I$_D$ to a corresponding pixel P on the basis of the gate signal and the data signal respectively received from the gate line and the data line electrically connected thereto. An inorganic light-emitting element 120 of the pixel P, which is electrically connected to the TFT circuit 600, may emit light on the basis of the driving current I$_D$ supplied from the TFT circuit 600.

A main controller 300 may process a source signal input through a source inputter 440 to generate an image signal corresponding to the input source signal.

A timing controller 500 may convert the image data transmitted from the main controller 300 into image data of a format that may be processed in a driver IC 200, and generate various control signals such as a timing control signal necessary for displaying the image data on the display panel 100.

A scan driver 210 may generate the gate signal based on the timing control signal transmitted from the timing controller 500, and a data driver 220 may generate the data signal based on the image data transmitted from the timing controller 500. The gate signal may have a gate voltage for turning the sub-pixel on, and the data signal may have a data voltage that expresses a grayscale of the image. The gate signal of the scan driver 210 may be transmitted to the TFT circuit 600 of each row through the gate lines GL, and the data signal of the data driver 220 may be transmitted to the TFT circuit 600 of each column through the data lines DL.

For example, when a frame rate is changed, the timing controller 500 may transmit a timing control signal for periodically generating a blanking period to the plurality of TFT circuits 600 of the display panel 100.

That is, the timing controller 500 may transmit a driving signal for periodically generating the blanking period to each TFT circuit 600 when the frame rate is changed.

For example, the timing controller 500 may transmit the driving signal to the plurality of TFT circuits 600 mounted on the display panel 100 through at least one of the gate line GL and the data line DL.

Each of the plurality of TFT circuits 600 periodically cuts off the driving current I$_D$ supplied to the inorganic light-emitting element 120 of the corresponding pixel P on the basis of the driving signal received from the timing controller 500 to periodically generate the blanking period.

As such, the display apparatus 1, according to one or more embodiments, allows the blanking period to be generated at a constant period even when the frame rate is changed, thereby preventing the user from recognizing a flickering phenomenon.

Although one display module 10 is provided in FIG. 18, the display apparatus 1 may include a plurality of display modules 10, and the display panel 100 of each display module 10 may be connected to the scan driver 210 and the data driver 220 through the gate line GL and the data line DL. When the display apparatus 1 includes the plurality of display modules 10, a periodic blanking period may be generated by transmitting a driving signal to the plurality of TFT circuits 600 included in each of the plurality of display modules 10.

Hereinafter, one or more embodiments related to a control method of the display apparatus 1 according to an aspect will be described. In the control method of the display apparatus 1, the display apparatus 1 according to some embodiments described above may be used. Accordingly, the contents described with reference to FIGS. 1 to 18 may be equally applied to the control method of the display apparatus 1.

Figure 19:
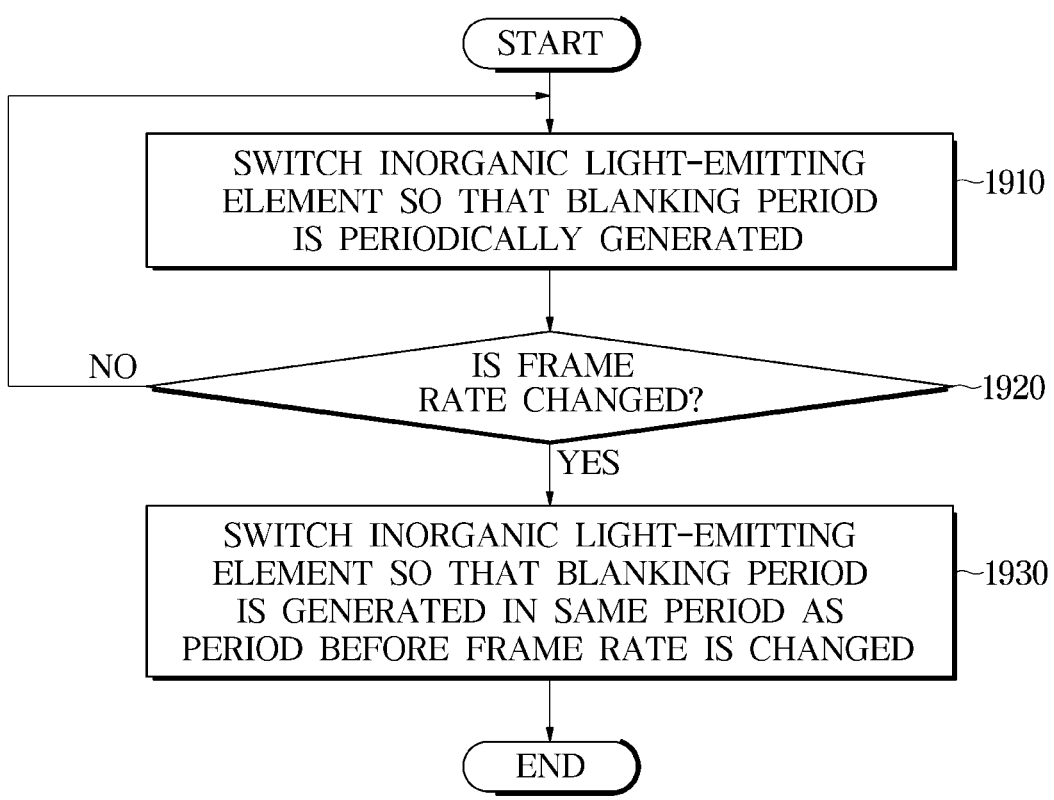
FIG. 19 is a flowchart illustrating a case in which a blanking period is periodically generated according to a change in frame rate in a control method of the display apparatus, according to one or more embodiments.

FIG. 19 is a flowchart illustrating a case in which a blanking period is periodically generated according to a change in frame rate in the control method of the display apparatus 1 according to one or more embodiments.

Referring to FIG. 19, the display apparatus 1, according to one or more embodiments, may switch the inorganic light-emitting element 120 so that a blanking period is periodically generated (1910).

The blanking period refers to a period in which the entire screen of the display apparatus 1 is turned off by momentarily turning off each of the inorganic light-emitting elements 120 included in the display apparatus 1, and the inorganic light-emitting element 120 does not emit light since the driving current is not supplied to each of the inorganic light-emitting elements 120 during the blanking period. The display apparatus 1 may determine whether an overcurrent, which may occur during a cell crack, is detected on the basis of the fact that the driving current is not supplied to the inorganic light-emitting element 120 during the blanking period.

For example, when the display apparatus 1 controls such that one blanking period is generated per one programming scan, the display apparatus 1 may control the display panel 100 such that the blanking period is generated at the same time point (e.g., directly before the end of the frame) in each of frames F1, F2, F3, and F4. That is, the display apparatus 1 may generate the blanking period that is repeated at a period corresponding to one frame size (e.g., 8.3 ms).

Accordingly, the display panel 100 of each of the plurality of display modules 10 included in the display apparatus 1 may generate the blanking period, in which light is not emitted, periodically.

When the frame rate is changed (an example of operation 1920), the display apparatus 1, according to one or more embodiments, may switch the inorganic light-emitting element 120 so that the blanking period is generated at the same period as a period thereof before the frame rate is changed (1930). That is, the switching of the inorganic light-emitting element 120 may cause the blanking period to be generated at the same period as a period thereof before the frame rate is changed. Alternatively or additionally, each micro pixel controller of the plurality of micro pixel controllers may be configured to switch the plurality of inorganic light-emitting elements causing a blanking period to be periodically generated in response to a frame rate being changed, and wherein a first period of the blanking period before the frame rate is changed matches a second period of the blanking period after the frame rate has been changed. In some embodiments, the timing controller may be configured to transmit, in response to the frame rate being changed, the timing control signal for periodically generating the blanking period to the plurality of micro pixel controllers of each display module of the plurality of display modules.

The display apparatus 1 may change the frame rate to correspond to a source signal. That is, when the main controller 300 processes the source signal to generate the image data, the main controller 300 may change the frame rate to correspond to a frame rate of the source signal.

For example, when a command for changing from a first mode, in which the frame rate is fixed, to a second mode, in which the frame rate is varied according to the source signal, is received, the display apparatus 1 may change the frame rate.

The display apparatus 1 may control the display panel 100 of each of the plurality of display modules 10 so that the blanking period is generated at a constant period even when the frame rate is changed.

When the display apparatus 1 includes the micro pixel controller 130, the timing controller 500 may transmit a timing control signal for periodically generating the blanking period to the plurality of micro pixel controllers 130 of each of the plurality of display modules 10 when the frame rate is changed.

For example, as shown in FIG. 13, when the frame rate is changed, the timing controller 500 may transmit the driving signal for periodically generating the blanking period to the pixel driving circuit 131P of each of the plurality of micro pixel controllers 130, according to some embodiments.

When the driving signal for periodically generating the blanking period is received, the pixel driving circuit 131P may switch the inorganic light-emitting element 120 so that the blanking period is generated at the same period.

That is, the pixel driving circuit 131P may periodically cut off the driving current $I_D$ supplied to the plurality of inorganic light-emitting elements 120 constituting two or more pixels electrically connected thereto on the basis of the driving signal received from the timing controller 500. That is, the pixel driving circuit 131P turns at least one of the switching transistor $TR_1$ and the driving transistor $TR_2$ off at a constant time interval to cut off the supply of the driving current $I_D$ to the inorganic light-emitting element 120, thereby periodically turning the inorganic light-emitting element 120 off.

Alternatively or additionally, according to some embodiments, when the frame rate is changed, the timing controller 500 may transmit a trigger signal for periodically generating the blanking period to the control circuit 131c of each of the plurality of micro pixel controllers 130.

When the trigger signal is received, the control circuit 131c may transmit the driving signal for periodically generating the blanking period to the plurality of pixel driving circuits 131PR, 131PG, and 131PB.

When the driving signal for periodically generating the blanking period is received, the pixel driving circuit 131P may switch the inorganic light-emitting element 120 so that the blanking period is generated at the same period.

That is, the pixel driving circuit 131P may periodically cut off the driving current $I_D$ supplied to the plurality of inorganic light-emitting elements 120 constituting two or more pixels electrically connected thereto on the basis of the driving signal received from the timing controller 500. For example, the pixel driving circuit 131P turns at least one of the switching transistor $TR_1$ and the driving transistor $TR_2$ off at a constant time interval to cut off the supply of the driving current $I_D$ to the inorganic light-emitting element 120, thereby periodically turning the inorganic light-emitting element 120 off.

When the display apparatus 1 does not include the micro pixel controller 130 and supplies the driving current $I_D$ to each pixel through the TFT circuit 600 mounted on the display panel 100, the timing controller 500 may transmit a timing control signal for periodically generating the blanking period to the plurality of TFT circuits 600 of the display panel 100 when the frame rate is changed.

That is, the timing controller 500 may transmit the driving signal for periodically generating the blanking period to each TFT circuit 600 when the frame rate is changed.

For example, the timing controller 500 may transmit the driving signal to the plurality of TFT circuits 600 mounted on the display panel 100 through at least one of the gate line GL and the data line DL.

Each of the plurality of TFT circuits 600 periodically cuts off the driving current $I_D$ supplied to the inorganic light-emitting element 120 of the corresponding pixel P on the basis of the driving signal received from the timing controller 500 to periodically generate the blanking period.

As such, the display apparatus 1, according to one or more embodiments, allows the blanking period to be generated at a constant period even when the frame rate is changed, thereby preventing the user from recognizing a flickering phenomenon.

Alternatively or additionally, the disclosed embodiments may be implemented in the form of a recording medium storing instructions executable by a computer. The instructions may be stored in the form of program code and, when executed by a processor, may generate a program module to perform the operations of the disclosed embodiments. The recording medium may be implemented as a computer-readable recording medium.

The computer-readable recording medium includes all kinds of recording media in which instructions that can be read by a computer are stored. For example, there may be a read-only memory (ROM), a random access memory (RAM), a magnetic tape, a magnetic disk, a flash memory, an optical data storage, and the like.

In a display apparatus, according to one or more embodiments, it is possible to prevent flickering that may occur due to a change in period of a blanking period caused by a change in frame rate by allowing the frame rate to be varied in response to a source signal and the blanking period to be generated periodically when the frame rate is changed.

Hereinbefore, the disclosed embodiments have been described with reference to the accompanying drawings. It should be appreciated by those skilled in the art to which the present disclosure pertains that forms different from the disclosed embodiments may be implemented without departing from the technical spirit and essential features of the present disclosure. The disclosed embodiments are illustrative and should not be construed as limitative.

What is claimed is:

1. A display apparatus comprising:
   a timing controller configured to generate a timing control signal; and
   a plurality of display modules, each display module of the plurality of display modules comprising:
   a plurality of pixels, and
   a plurality of micro pixel controllers electrically connected to a plurality of inorganic light-emitting elements constituting two or more pixels, and configured to switch the plurality of inorganic light-emitting elements based on the timing control signal, and
   wherein each of the plurality of micro pixel controllers is configured to switch the plurality of inorganic light-emitting elements causing a blanking period to be periodically generated in response to a frame rate being changed.

2. The display apparatus of claim 1, wherein each of the plurality of micro pixel controllers is configured to switch the plurality of inorganic light-emitting elements causing a first period of the blanking period before the frame rate is changed to match a second period of the blanking period after the frame rate has been changed.

3. The display apparatus of claim 2, wherein
each of the plurality of micro pixel controllers comprises:
- a pixel driving circuit configured to output a driving current to be applied to the two or more pixels; and
- a control circuit configured to distribute a gate signal and a data signal to each pixel driving circuit based on the timing control signal.

4. The display apparatus of claim 3, wherein the timing controller is configured to transmit the timing control signal for periodically generating the blanking period to the plurality of micro pixel controllers of each of the plurality of display modules in response to the frame rate being changed.

5. The display apparatus of claim 4, wherein the timing controller is configured to transmit a driving signal for periodically generating the blanking period to the pixel driving circuit of each of the plurality of micro pixel controllers in response to the frame rate being changed.

6. The display apparatus of claim 5, wherein the pixel driving circuit is configured to periodically cut off the driving current applied to the plurality of inorganic light-emitting elements based on the driving signal received from the timing controller.

7. The display apparatus of claim 4, wherein the timing controller is configured to transmit a trigger signal for periodically generating the blanking period to the control circuit of each of the plurality of micro pixel controllers in response to the frame rate being changed.

8. The display apparatus of claim 7, wherein the control circuit is configured to control the pixel driving circuit to periodically cut off the driving current applied to the plurality of inorganic light-emitting elements based on the trigger signal.

9. The display apparatus of claim 1, further comprising:
- a source inputter configured to receive a source signal; and
- a main controller configured to process the source signal to generate image data, and change the frame rate to correspond to a frame rate of the source signal.

10. A control method of a display apparatus, the control method comprising:
- controlling a plurality of micro pixel controllers to switch a plurality of inorganic light-emitting elements based on a timing control signal of a timing controller of the display apparatus; and
- switching the plurality of inorganic light-emitting elements by controlling the plurality of micro pixel controllers causing a blanking period to be periodically generated in response to a frame rate being changed.

11. The control method of claim 10, wherein the switching of the plurality of inorganic light-emitting elements comprises switching the plurality of inorganic light-emitting elements causing a first period of the blanking period before the frame rate is changed to match a second period of the blanking period after the frame rate has been changed.

12. The control method of claim 11, wherein
each of the plurality of micro pixel controllers includes:
- a pixel driving circuit configured to output a driving current to be applied to the plurality of pixels; and
- a control circuit configured to distribute a gate signal and a data signal to each pixel driving circuit based on the timing control signal.

13. The control method of claim 12, further comprising transmitting the timing control signal for periodically generating the blanking period to the plurality of micro pixel controllers of each of a plurality of display modules using the timing controller in response to the frame rate being changed.

14. The control method of claim 13, wherein the transmitting of the timing control signal includes transmitting a driving signal for periodically generating the blanking period to the pixel driving circuit of each of the plurality of micro pixel controllers in response to the frame rate being changed.

15. The control method of claim 14, further comprising periodically cutting off the driving current applied to the plurality of inorganic light-emitting elements by the pixel driving circuit based on the driving signal received from the timing controller.

* * * * *